(12) United States Patent
Shudo

(10) Patent No.: US 11,520,229 B2
(45) Date of Patent: Dec. 6, 2022

(54) IMPRINT APPARATUS AND METHOD OF MANUFACTURING ARTICLE

(71) Applicant: CANON KABUSHIKI KAISHA, Tokyo (JP)

(72) Inventor: Shinichi Shudo, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 79 days.

(21) Appl. No.: 17/113,844

(22) Filed: Dec. 7, 2020

(65) Prior Publication Data

US 2021/0181624 A1 Jun. 17, 2021

(30) Foreign Application Priority Data

Dec. 16, 2019 (JP) .............................. JP2019-226804

(51) Int. Cl.
*G03F 7/00* (2006.01)
*B29C 33/42* (2006.01)
*B29C 35/08* (2006.01)

(52) U.S. Cl.
CPC .......... *G03F 7/0002* (2013.01); *B29C 33/424* (2013.01); *B29C 35/0805* (2013.01); *B29C 35/0888* (2013.01); *B29C 2033/426* (2013.01)

(58) Field of Classification Search
CPC . G03F 7/0002; G03F 7/70083; B29C 33/424; B29C 35/0805; B29C 35/0888; B29C 2033/426; H01L 21/027; B41M 7/00; F26B 3/28; B05D 3/06; B44C 1/22
See application file for complete search history.

(56) References Cited

U.S. PATENT DOCUMENTS

| 8,480,946 B2 | 7/2013 | Mikami |
| 2009/0224436 A1* | 9/2009 | Mikami ................ G03F 7/0002 264/447 |
| 2010/0189839 A1* | 7/2010 | Sano ....................... B29C 59/02 425/174.4 |
| 2013/0056905 A1* | 3/2013 | Hamaya ................ G03F 7/0002 264/293 |
| 2015/0004275 A1* | 1/2015 | Miyajima ............. G03F 7/2002 425/385 |
| 2018/0067392 A1* | 3/2018 | Murasato .............. G03F 7/0002 |
| 2021/0225638 A1* | 7/2021 | Fukuhara ............ H01L 21/0271 |

FOREIGN PATENT DOCUMENTS

JP 2009212449 A 9/2009

* cited by examiner

*Primary Examiner* — Niki Bakhtiari
*Assistant Examiner* — Inja Song
(74) *Attorney, Agent, or Firm* — Rossi, Kimms & McDowell LLP

(57) ABSTRACT

An imprint apparatus that performs a supply step of supplying an imprint material onto each of shot regions adjacent to each other on a substrate and, after the supply step, execute an imprint process including a contact step, a curing step, and a mold releasing step for each of the shot regions. The apparatus comprises an irradiator that irradiates the imprint material on the shot region with light in the curing step, and a light-shielding member that defines an irradiation region of the light from the irradiator, wherein the light-shielding member defines the irradiation region such that the imprint material in an end portion of a first shot region on a side of a second shot region adjacent to the first shot region is complementarily cured by light irradiation in the curing step performed on the second shot region.

13 Claims, 18 Drawing Sheets

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique has gained attention as a new pattern formation technique for manufacturing a semiconductor device. An imprint apparatus forms an imprint material pattern on a substrate by curing an imprint material in a state in which a mold has been brought into contact with the imprint material on the substrate such as a silicon wafer, a glass plate, or the like and separating the cured imprint material from the mold. Note that as one of the methods of curing an imprint material, there is a photo-curing method of curing the imprint material by irradiation with light (ultraviolet light).

In an imprint apparatus, the imprint material may be extruded from the pattern region when the imprint material is brought into contact with the mold, and this may influence the subsequent imprint process. To the contrary, Japanese Patent Laid-Open No. 2009-212449 describes that an imprint material in the outer periphery of a shot region is kept soft without being completely cured so that the imprint process can be continued even if the imprint material is extruded from the pattern region and adheres to a mold.

In a conventional imprint apparatus, a supply step of supplying (applying) an imprint material to a substrate, a contact step of bringing the imprint material and a mold into contact with each other, a curing step of curing the imprint material, and a mold releasing step of separating the mold from the imprint material are repeatedly performed for each shot region. However, in recent years, in order to improve throughput, a sequence has been considered in which the supply step is performed in advance on a plurality of shot regions adjacent to each other on the substrate or all the shot regions on the substrate, and then the contact step, the curing step, and the mold releasing step are performed for each shot region. In this specification, such a sequence is also referred to as "multi-area advance application".

In the multi-area advance application, light for curing the imprint material on a shot region subjected to an imprint process also reaches an adjacent shot region, resulting in partially curing the imprint material on the adjacent shot region as well. Accordingly, the imprint materials in different cured states coexist in one shot region. In this case, in the contact step, not only the pattern cannot be successfully formed since the unexposed imprint material cannot be pressed with an appropriate force due to an insufficient pressing force, but also the pattern portion of the mold may be damaged.

As has been described above, Japanese Patent Laid-Open No. 2009-212449 describes that the imprint material in the outer periphery of the shot region is not completely cured but kept soft, but since the sequence such as multi-area advance application is not assumed, the problem as described above cannot be solved.

SUMMARY OF THE INVENTION

The present invention provides, for example, an imprint apparatus advantageous in achieving both the protection performance of the pattern portion of a mold and throughput.

The present invention in its one aspect provides an imprint apparatus that performs a supply step of supplying an imprint material onto a substrate, a contact step of bringing the imprint material on the substrate and a mold into contact with each other, a curing step of curing the imprint material by light irradiation in a state in which the imprint material and the mold are in contact with each other, and a mold releasing step of separating the mold from the cured imprint material, wherein the imprint apparatus is configured to perform the supply step on each of a plurality of shot regions adjacent to each other on the substrate and, after the supply step, execute an imprint process including the contact step, the curing step, and the mold releasing step for each shot region of the plurality of shot regions, the imprint apparatus comprising an irradiator configured to irradiate the imprint material on the shot region with light in the curing step, and a light-shielding member configured to define an irradiation region of the light from the irradiator, wherein the light-shielding member defines the irradiation region such that the imprint material in an end portion of a first shot region on a side of a second shot region adjacent to the first shot region is complementarily cured by light irradiation in the curing step performed on the second shot region.

Further features of the present invention will become apparent from the following description of exemplary embodiments (with reference to the attached drawings).

BRIEF DESCRIPTION OF THE DRAWINGS

FIGS. 4A1 to 4C3 are views showing the relationship among a plurality of shot regions adjacent to each other and the light irradiation ranges;

FIGS. 6A1 to 6C3 are views showing the relationship among the plurality of shot regions adjacent to each other and the light irradiation ranges;

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be

First Embodiment

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

Figure 1:
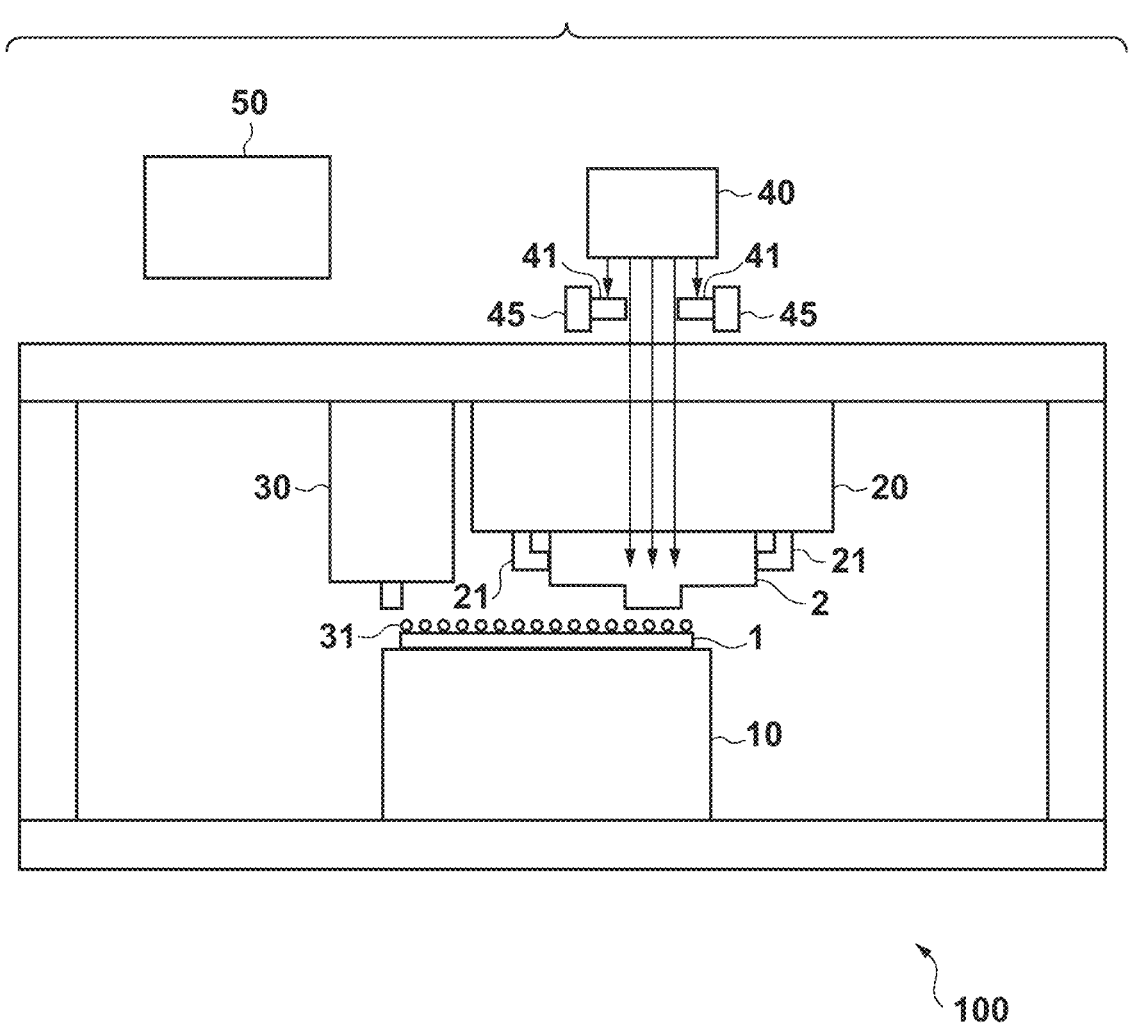
FIG. 1 is a view showing the arrangement of an imprint apparatus.

FIG. 1 is a view showing the arrangement of an imprint apparatus 100 according to an embodiment. In the present specification and the drawings, directions are given in an XYZ coordinate system with the horizontal plane as the XY plane. Generally, the substrate 1 is placed on the substrate stage 10 so that its surface is parallel to the horizontal plane (XY plane). Therefore, in the following, the directions perpendicular to each other in the plane along the surface of the substrate 1 are defined as the X-axis and the Y-axis, and the direction perpendicular to the X-axis and the Y-axis is defined as the Z-axis. Further, in the following, the directions parallel to the X-axis, Y-axis, and Z-axis in the XYZ coordinate system are referred to as X-direction, Y-direction, and Z-direction, respectively.

The substrate stage 10 holds the substrate 1, and is driven to position the substrate 1. A mold holder 20 that holds a mold 2 functions as a mold driver (imprint head) that drives the mold 2. The mold holder 20 holds the mold 2 via a correction unit 21. The correction unit 21 includes a shape correction mechanism that corrects the shape of the mold 2. By driving of the mold holder 20, the mold 2 and an imprint material 31 on the substrate 1 can be brought into contact with each other, and the mold 2 can be separated (released) from the imprint material 31 on the substrate 1. A supply unit 30 (dispenser) supplies (discharges) the imprint material onto the substrate 1. The supply unit 30 may have a function of applying the imprint material arranged on the substrate 1. An irradiator 40 irradiates the imprint material 31 with light (ultraviolet light) via the mold 2 to cure the imprint material 31 in a state in which the mold 2 and the imprint material 31 on the substrate 1 are in contact with each other. The irradiator 40 can include a light source such as a halogen lamp or a mercury lamp that generates i-line and/or g-line. A light-shielding member 41 forms an opening (aperture) that defines an irradiation region of light from the irradiator 40 to a shot region. A driver 45 adjusts the size of the opening by driving the light-shielding member 41.

A controller 50 manages execution of an imprint process by comprehensively controlling the respective units of the imprint apparatus 100. The controller 50 includes a processing unit such as a CPU, a microcontroller, or a microprocessor. The processing unit executes a control program related to the imprint process stored in a memory inside or outside the controller 50.

The arrangement of the imprint apparatus 100 is roughly as described above. Next, an imprint process executed by the imprint apparatus 100 will be described.

The imprint process can include a contact step of bringing the imprint material supplied onto the substrate and the mold into contact with each other, a curing step of curing the imprint material, and a mold releasing step of separating the imprint material and the mold from each other. In this embodiment, a supply step of supplying the imprint material onto the substrate is collectively performed in advance on a plurality of shot regions adjacent to each other or all the shot regions on the substrate. Thereafter, the imprint process (the contact step, the curing step, and the mold releasing step) is performed for each shot region. Such a sequence (multi-area advance application) is employed in this embodiment. Operations according to this sequence will be specifically described below. The operations are performed by the processing unit 50 executing the control program.

In the supply step, by discharging the imprint material from the supply unit 30 while driving the substrate stage 10 in the X direction or the Y direction immediately below the supply unit 30, the imprint material 31 is supplied to the shot region (imprint region) on the substrate 1. In this embodiment, the imprint material is collectively supplied to a plurality of shot regions adjacent to each other on the substrate 1.

Next, in the contact step, the substrate stage 10 moves immediately below the mold holder 20. When the shot region has reached immediately below the mold holder 20, the substrate stage 10 stops. Then, by the mold holder 20 lowering the mold 2, the mold 2 and the imprint material 31 on the substrate 1 start to come into contact with each other. At this time, the correction unit 21 corrects the mold 2 such that the pattern portion of the mold 2 becomes a predetermined shape. When the mold 2 is in contact with the imprint material 31 on the substrate 1, the pattern portion of the mold 2 is filled with the imprint material 31.

Next, in the curing step, the irradiator 40 irradiates the imprint material with light (ultraviolet light) to cure it. Then, in the mold releasing step, the mold holder 20 lifts the mold 2, and the mold 2 is separated from the cured imprint material.

After the mold releasing operation is completed, the substrate stage 10 is driven such that the next shot region comes immediately below the mold holder 20. When the shot region on the substrate 1 has reached immediately below the mold holder 20, the contact step, the curing step, and the mold releasing step are performed on the shot region. The series of operations is repeated for all the shot regions where the imprint material has been supplied onto the substrate 1. If the imprint process has been completed for all the shot regions, the substrate 1 is unloaded to the outside of the imprint apparatus 100.

With reference to FIGS. 2A to 2D, an example of the imprint sequence for the substrate 1 by the imprint apparatus 100 will be described. In the example shown in FIGS. 2A to 2D, the imprint material is supplied to each shot region in one row along the X direction in the supply step, and then the contact step, the curing step, and the mold releasing step are performed for each shot region in this row. In such multi-area advance application, conventionally, light for curing the imprint material on a shot region subjected to an imprint process also reaches an adjacent shot region, resulting in partially curing the imprint material on the adjacent shot region as well. Accordingly, the imprint materials in different cured states coexist in one shot region. In this case, in the contact step, not only the pattern cannot be successfully formed since the unexposed imprint material cannot be pressed with an appropriate force due to an insufficient pressing force, but also the pattern portion of the mold may be damaged. In addition, if the imprint materials in different cured states coexist in one shot region, the mold may slip or tilt when the mold is brought into contact with the imprint material, so not only the pattern cannot be successfully formed but also the pattern portion of the mold may be damaged.

In this embodiment, the light-shielding member 41 defines the irradiation region such that the imprint material in the end portion of a first shot region on the side of a second shot region adjacent to the first shot region is complementarily cured by light irradiation in the curing step for the second shot region. This solves the problem as described above. A specific example will be described below.

Figure 2A:
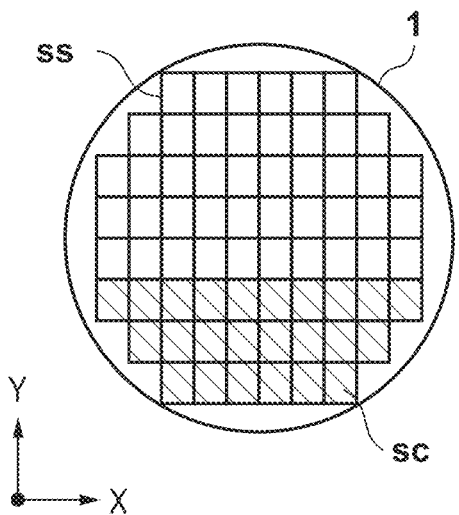
FIGS. 2A to 2D are views showing an example of an imprint sequence.
Figure 2B:
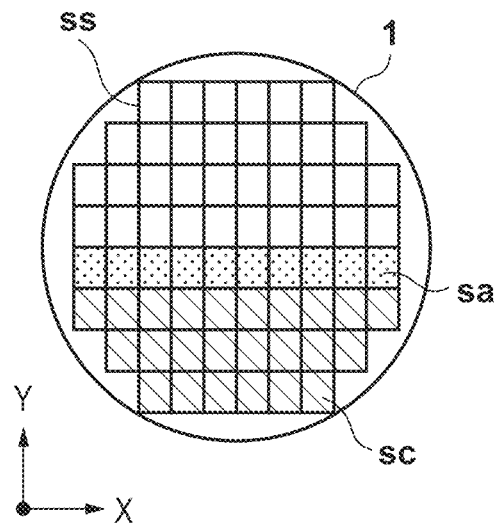

FIG. 2A shows a state in which the imprint process has been already completed in hatched shot regions sc, and the imprint material has not been supplied to shot regions ss shown in a white background. FIG. 2B shows a state in which, from the state shown in FIG. 2A, the imprint material has been supplied to shot regions sa shown in a dot background, which are shot regions in a row adjacent to the row where the imprint process has been completed immediately before. Note that in this example, the imprint material is supplied to all the shot regions in one row, but the imprint material may be supplied to only one shot region, or the imprint material may be supplied to a plurality of every two shot regions.

Figure 2C:
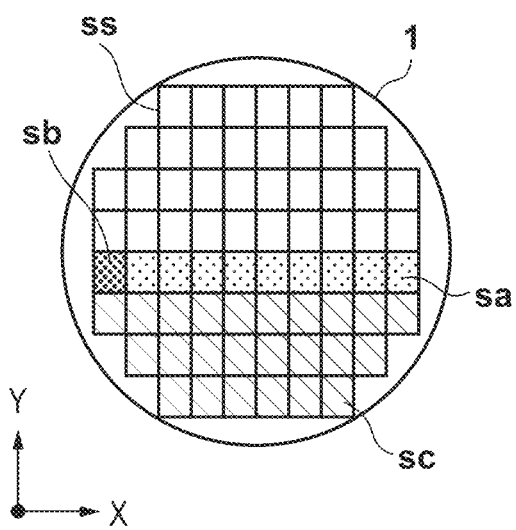

FIG. 2C shows a state in which the imprint process is executed on a shot region sb, that is, the mold 2 and the imprint material on the shot region sb have been brought into contact with each other by the mold holder 20 lowering the mold 2. Thereafter, the irradiator 40 irradiates the imprint material with light to cure it, and the mold holder 20 lifts the mold 2 to separate the mold 2 from the cured imprint material. Thus, a new pattern is formed in the shot region sb.

Figure 2D:
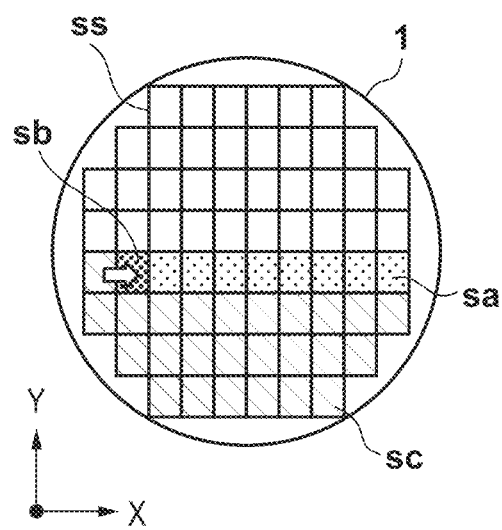

After the imprint process shown in FIG. 2C, the shot region subjected to the imprint process moves to the adjacent shot region as shown in FIG. 2D. In FIG. 2D, the shot region which has been subjected to the imprint process in FIG. 2C is shown as the hatched region to indicate that the imprint process has been completed. The substrate stage 10 is driven such that the next shot region comes immediately below the mold holder 20. Note that in this example, the imprint process is executed in the order from the −Y direction to the +Y direction and from the −X direction to the +X direction, but the imprinting order can be arbitrarily selected in consideration of the productivity and arrangement of the apparatus.

Figure 3A:
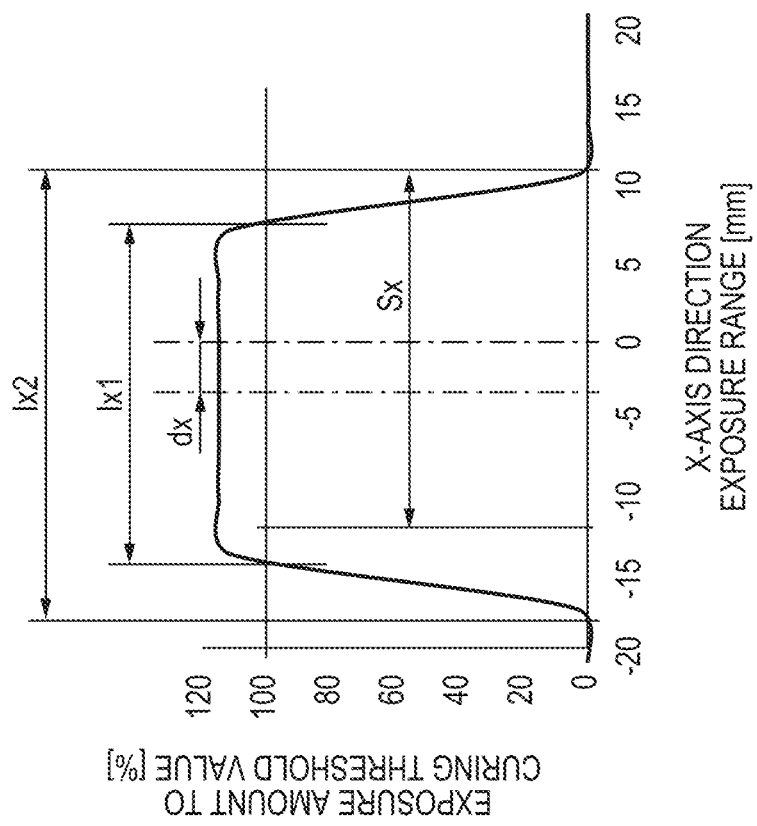
FIGS. 3A and 3B are views showing the relationship among a shot region and light irradiation regions.
Figure 3B:
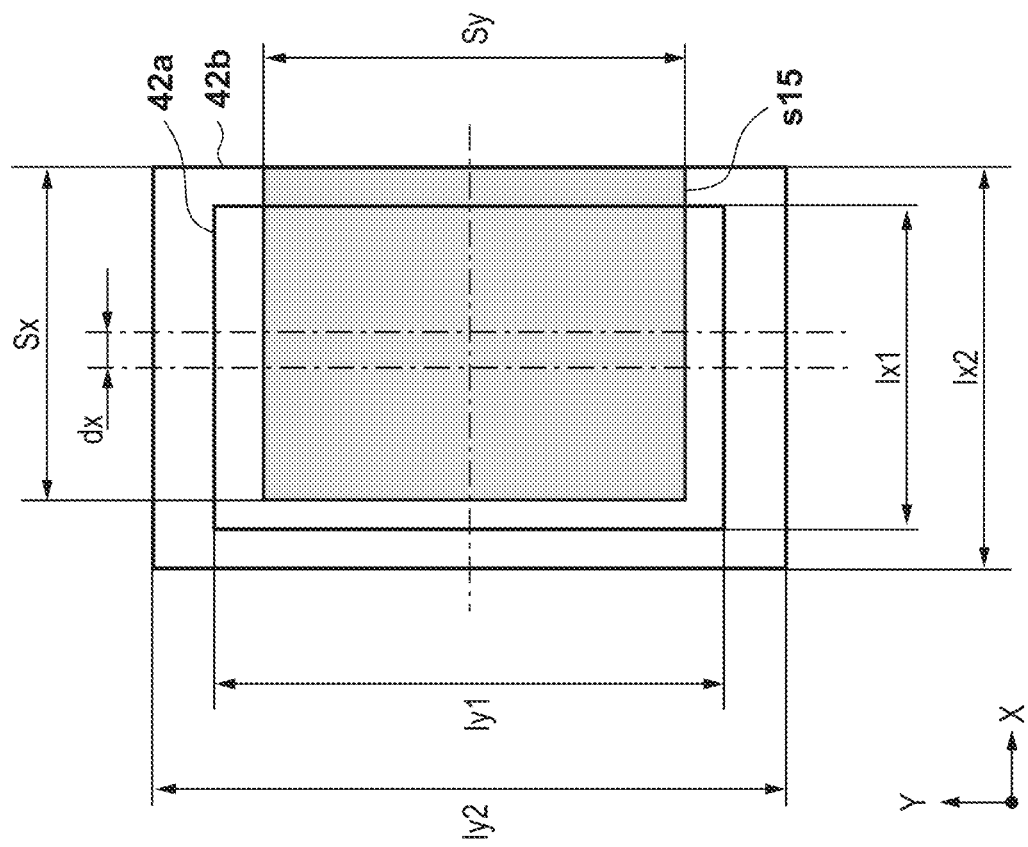

FIGS. 3A and 3B are views showing the relationship among a shot region s15 on the substrate 1 and the light beams applied from the irradiator 40 upon executing the imprint process in the order from the −Y direction to the +Y direction and from the −X direction to the +X direction in the imprint apparatus 100. FIG. 3A shows the relationship among the shot region s15 and the irradiation regions of the light beams from the irradiator 40 to the shot region s15. FIG. 3B shows the relationship between the X-direction position of the shot region and the exposure amount. The ordinate of FIG. 3B represents the ratio of the exposure amount to the curing threshold value of the imprint material. FIG. 3B shows that the exposure amount exceeds the curing threshold value of the imprint material in the central portion of the shot region in the X direction, but the exposure amount does not reach the curing threshold value of the imprint material in the end portions in the X direction.

In FIG. 3A, a first irradiation region 42a is a region which is irradiated with light having a first light amount exceeding the curing threshold value of the imprint material, and the X-direction width and the Y-direction width of the first irradiation region 42a are indicated by Ix1 and Iy1, respectively. A second irradiation region 42b is a region outside the first irradiation region 42a and surrounding the first irradiation region 42a. The X-direction width and the Y-direction width of the second irradiation region 42b are indicated by Ix2 and Iy2, respectively. The second irradiation region 42b is a region which is irradiated with light having a second light amount not exceeding the curing threshold value of the imprint material but capable of curing the imprint material to the extent that the imprint material does not adhere to the mold 2 at the time of mold releasing. The first irradiation region 42a and the second irradiation region 42b may be regions that are irradiated with light beams from the same light source, or may be regions that are simultaneously irradiated with light beams from different light sources. The positional relationship between the first irradiation region 42a and the second irradiation region 42b is, for example, the positional relationship in which they have the same center in the X and Y directions.

The shot region s15 is a shot region (first shot region) subjected to the imprint process in which the mold 2 is brought into contact with the imprint material on the substrate 1 to form a pattern, and the X-direction width and the Y-direction width are indicated by Sx and Sy, respectively. The values of Sx and Sy are arbitrarily set in accordance with the productivity of the apparatus and the use of the product. Here, the imprinting order is set in the order from the −Y direction to the +Y direction and from the −X direction to the +X direction. In this case, when the shot region s15 is irradiated with exposure light from the irradiator 40, no imprint material or the exposed imprint material exists in the regions adjacent to the shot region s15 on the −X side (the left side in the drawing surface) and the −Y side (the lower side in the drawing surface). No imprint material has been supplied to the region adjacent to the shot region s15 on the +Y side (the upper side on the drawing surface). A shot region (second shot region) subjected to the imprint process after the shot region s15 exists adjacent to the shot region s15 on the +X side (the right side on the drawing surface), and the imprint material in an unexposed state (uncured state) exists therein.

In this case, when the light is applied so as to include the entire surface of the shot region s15 subjected to the imprint process, a part of the imprint material in the shot region adjacent to the shot region s15 is also cured. If the imprint process is executed in a state in which a part of the imprint material is cured, the mold 2 may be damaged so the desired pattern may not be formed. Therefore, in this embodiment, the light-shielding member 41 defines the irradiation region so as to satisfy, for example, the following conditions:

(a) among the shot regions adjacent to the shot region s15 subjected to the imprint process, the end portion, on the shot region s15 side, of the adjacent shot region having undergone the imprint process is irradiated with light, and (b) among the shot regions adjacent to the shot region s15 subjected to the imprint process, the adjacent shot region having not undergone the imprint process is not irradiated with light.

That is, in the example shown in FIG. 3A, the second irradiation region 42b is adjusted such that no exposure light extrudes to the +X direction side. Accordingly, in this embodiment, the second irradiation region 42b is adjusted such that its end on the +X side match the end of the shot region s15 on the +X side. As for the −X direction and ±Y directions of the shot region subjected to the imprint process, there is no problem even if the exposure light protrudes to the adjacent shot region so that, from the viewpoint of the productivity of the apparatus, the irradiation region can be adjusted such that the exposure light exceeding the curing threshold value of the imprint material extrudes from the shot region subjected to the imprint process. Therefore, the second irradiation region 42b is adjusted such that its center in the Y direction matches that of the shot region s15. The relationship among Ix1 and Iy1 of the first irradiation region 42a and Sx and Sy of the shot region s15 is expressed by the following inequalities:

$$Ix1 \geq Sx \quad (1)$$

$$Iy1 \geq Sy \quad (2)$$

Further, an X-direction distance dx between each of the centers of the first irradiation region 42a and the second irradiation region 42b and the center of the shot region s15 is expressed by the following equation:

$$dx = (Ix2 - Sx)/2 \quad (3)$$

The direction of dx is determined by the imprinting order. If the imprinting order is the order from the −X direction to the +X direction, the direction of dx is the direction (−X direction) opposite to the direction (+X direction) from the center of the shot region s15 toward the next shot region subjected to the imprint process. The light-shielding member 41 defines, as the irradiation region, the region having the center at a position offset in the −X direction from the center of the shot region s15.

The exposure amount and irradiation region of each of the first irradiation region 42a and the second irradiation region 42b may be adjusted by adjusting the illuminance of the light source, or may be adjusted by adjusting the light-shielding member 41 of the irradiator 40. Alternatively, they may be adjusted using a light-shielding mold provided with a light-shielding film. The exposure amount and the irradiation region can be adjusted by adjusting the film thickness or the like of the light-shielding film provided outside the pattern region.

FIGS. 4A1 to 4C3 show the relationship among the shot region s15 and shot regions s16 and s17 adjacent to each other, which continuously undergo the imprint process, and the light beams applied from the irradiator 40. The imprint process is executed on the substrate 1 in the order from the −Y direction to the +Y direction and from the −X direction to the +X direction. FIGS. 4A1, 4B1, and 4C1 show the states of the substrate 1 during the imprint process executed on the shot regions s15, s16, and s17, respectively. FIGS. 4A2, 4B2, and 4C2 show the states of the imprint materials on the shot regions s15, s16, and s17 during the imprint process executed on the shot regions s15, s16, and s17, respectively. Each of FIGS. 4A3, 4B3, and 4C3 shows the relationship among the X-direction positions of the shot regions s15, s16, and s17 and the exposure amount. In each of FIGS. 4A3, 4B3, and 4C3, the ordinate represents the ratio of the exposure amount to the curing threshold value of the imprint material. The solid line indicates the integrated exposure amount up to each shot region, the dashed line indicates the exposure amount of each shot region during the exposure, and the dotted line indicates the exposure history up to immediately before the exposure of each shot region.

An imprint material 31d in the end portion of the shot region s15 on the shot region s16 side (the second shot region side) indicates that it is in the semi-cured state. When an imprint material 31a is irradiated with light having a light amount equal to or smaller than the curing threshold value, the imprint material 31a becomes the imprint material 31d in a semi-cured state. The semi-cured state is a state in which the viscosity is lower than in the cured state but the pattern transferred from the mold 2 is maintained. Since the imprint material 31d and the substrate 1 are in tight contact with each other with a force equal to or larger than a mold releasing force generated at the time of mold releasing, so the imprint material 31d does not adhere to the mold 2 side upon releasing the mold. The adhesive force of the imprint material itself and the adhesive force between the imprint material and the substrate 1 are determined by the physical property and state of the imprint material, the surface state of the substrate 1, and the surrounding environmental atmosphere. Note that the shots in the vicinity of the edge portions of the substrate 1 are omitted in each of FIGS. 4A1, 4B1, and 4C1, but from the viewpoint of improving the productivity of the apparatus, the imprint process can be executed in the regions in the edge portions.

Figures 1, 4A:
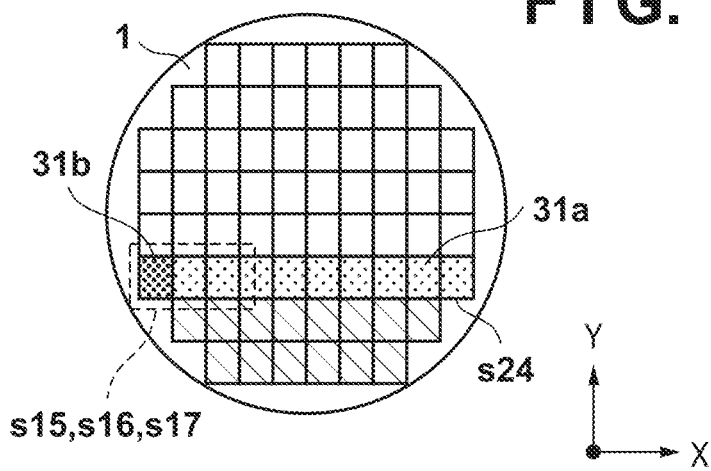
Figures 2, 4A:
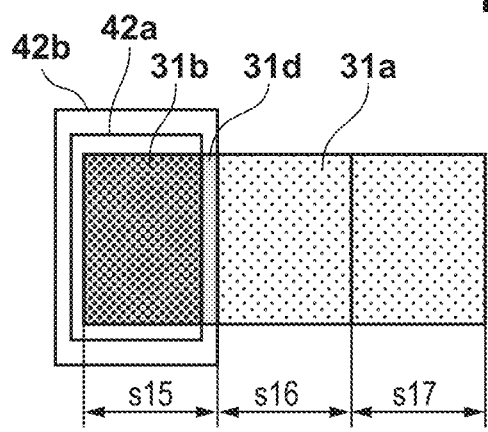
Figures 3, 4A:
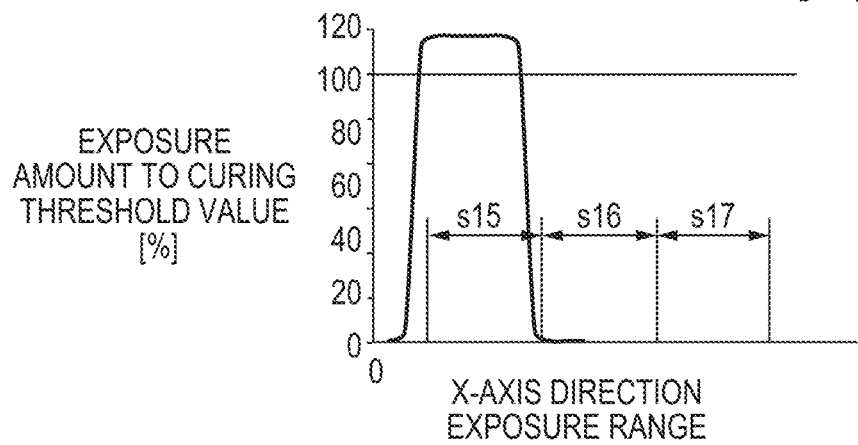

In FIG. 4A2, an imprint material 31b in the first irradiation region 42a exposed with the light amount exceeding the curing threshold value in the shot region s15 is cured, and the imprint material 31d in the second irradiation region 42b exposed with the light amount equal to or smaller than the curing threshold value becomes semi-cured. The imprint material 31d in the semi-cured state in the shot region s15 is complementarily exposed and cured by the light irradiation in the imprint process executed on the adjacent shot region s16.

Figures 1, 4B:
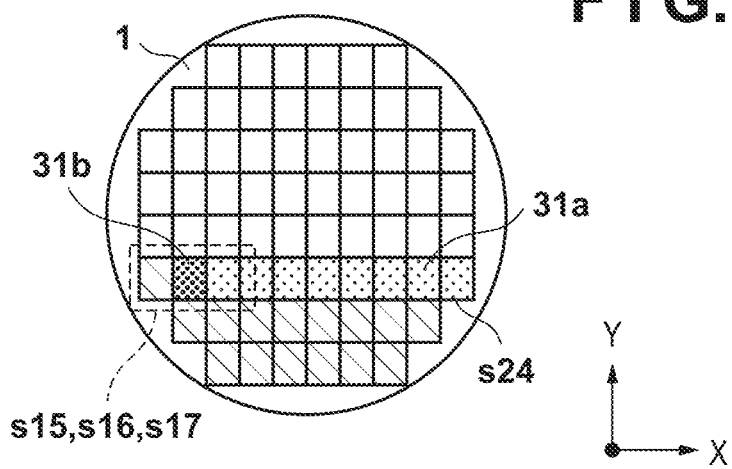
Figures 2, 4B:
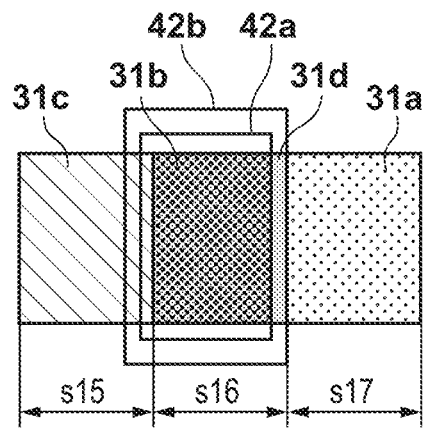
Figures 3, 4B:
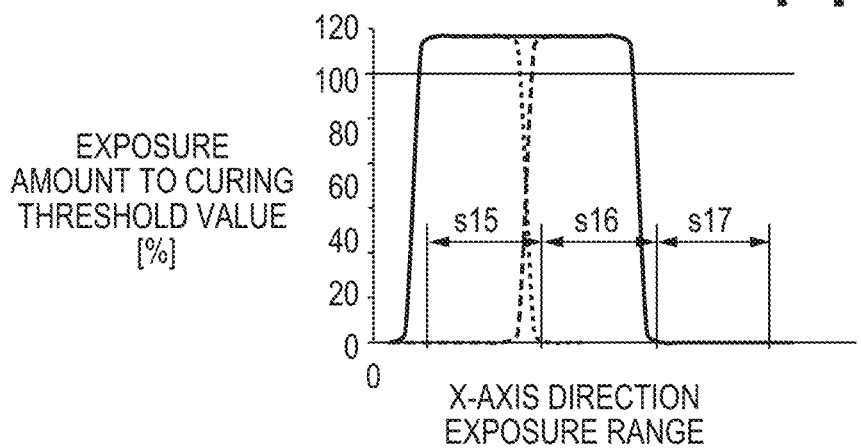
Figures 1, 4C:
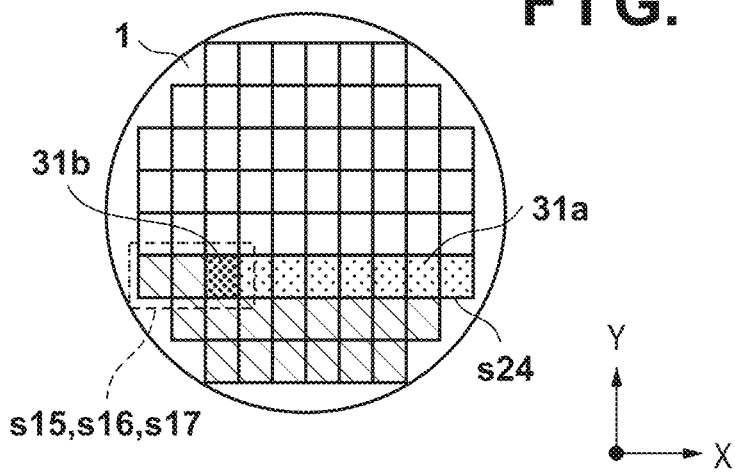
Figures 2, 4C:
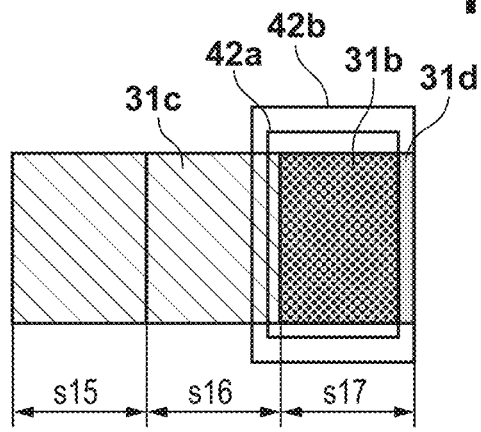
Figures 3, 4C:
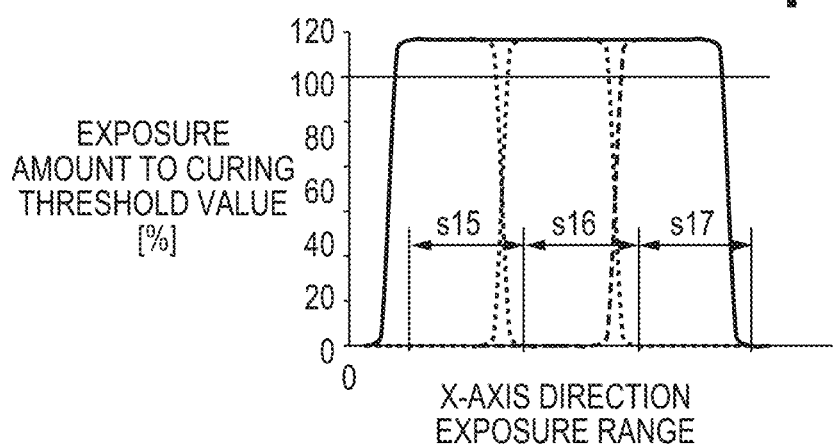

Similarly, in FIG. 4B2, the imprint material 31b in the first irradiation region 42a exposed with the light amount exceeding the curing threshold value in the shot region s16 is cured, and the imprint material in the second irradiation region 42b exposed with the light amount equal to or smaller than the curing threshold value becomes semi-cured. The imprint material 31d in the semi-cured state in the shot region s16 is complementarily exposed and cured by the light irradiation to the adjacent shot region s17.

Note that the cured state of the imprint material having undergone the exposure with the light amount exceeding the curing threshold value does not change even if it undergoes further exposure thereafter, so that a good pattern is maintained. However, a situation can be assumed in which this does not apply to all imprint materials to be used. Therefore, it is desirable that the integrated exposure amount distribution of the imprint material in the shot region is almost uniform, and it is desirable to perform at 8% or less as one standard. There is no unexposed imprint material in the shot region adjacent to a shot region s24. In this case, the controller 50 may control the driver 45 such that the entire surface of the shot region s24 is irradiated with the light having the light amount exceeding the curing threshold value of the imprint material. Thus, the imprint material is collectively cured in the shot region s24. Alternatively, without driving the light-shielding member 41 of the irradiator 40 after the exposure of the shot region s24, the light may be applied to a position shifted from the shot region s24 by one shot region in the +X-axis direction to complementarily cure the imprint material on the shot region s24. If the shot region s24 includes the outer peripheral portion of the substrate 1 but the unexposed imprint material exists within the first irradiation region 42a, it is desirable to perform exposure without changing the adjusted position of the light-shielding member 41. If the unexposed imprint material exists outside the first irradiation region 42a, the light-shielding member 41 is driven so as to extend the first irradiation region 42a and the second irradiation region 42b and the exposure is performed. Alternatively, after the exposure of the shot region s24, the light may be applied to a position shifted from the shot region s24 by one shot region in the +X-axis direction to complementarily cure the imprint material on the shot region s24. The imprint apparatus 100 performs the series of operations on all the shot regions of the substrate 1 to form the pattern of the mold 2 on each of all the shot regions.

Figure 5B:
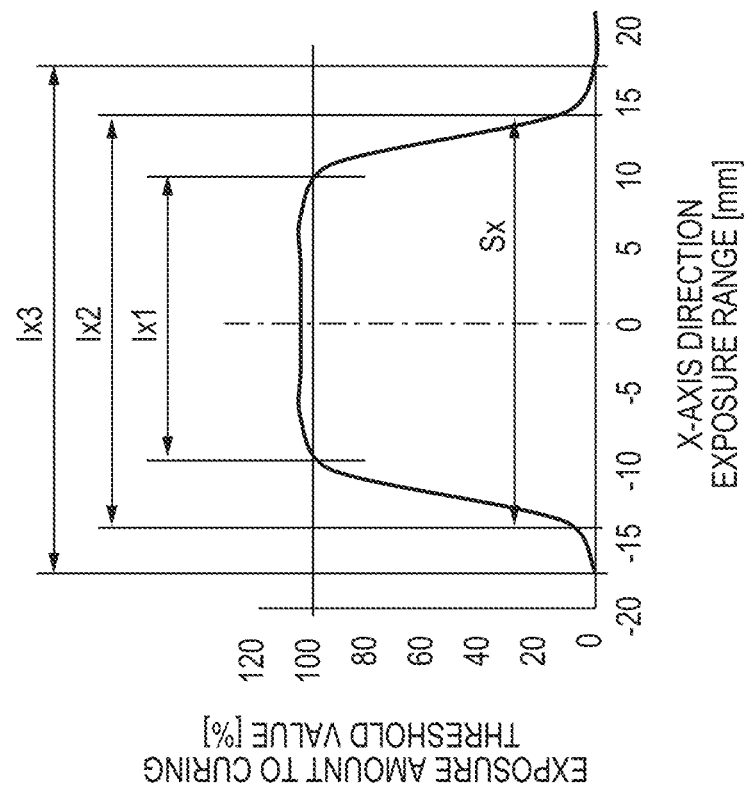
FIGS. 5A and 5B are views showing the relationship among the shot region and the light irradiation regions.
Figure 5A:
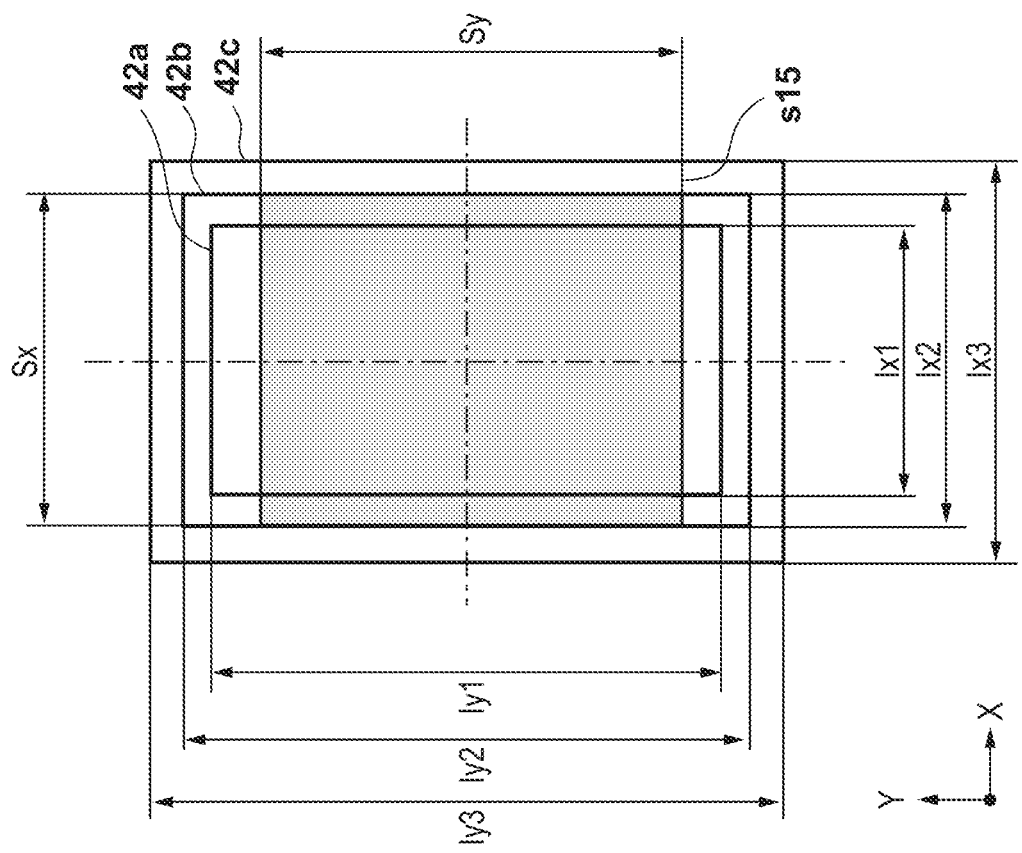

FIGS. 5A and 5B are views showing the relationship among the shot region s15 on the substrate 1 and the light beams applied from the irradiator 40 upon executing the imprint process in the order from the −Y direction to the +Y direction and from the −X direction to the +X direction in the imprint apparatus 100. FIG. 5A shows the relationship among the shot region s15 and the irradiation regions of the light beams from the irradiator 40 to the shot region s15. FIG. 5B shows the relationship between the X-direction position of the shot region and the exposure amount. The ordinate of FIG. 5B represents the ratio of the exposure amount to the curing threshold value of the imprint material.

In FIG. 5A, the first irradiation region 42a is a region which is irradiated with light having a first light amount exceeding the curing threshold value of the imprint material, and the X-direction width and the Y-direction width of the first irradiation region 42a are indicated by Ix1 and Iy1, respectively. The second irradiation region 42b is a region outside the first irradiation region 42a and surrounding the first irradiation region 42a. The X-direction width and the Y-direction width of the second irradiation region 42b are indicated by Ix2 and Iy2, respectively. A third irradiation region 42c is a region outside the second irradiation region 42b and surrounding the second irradiation region 42b. The X-direction width and the Y-direction width of the third irradiation region are indicated by Ix3 and Iy3, respectively. The second irradiation region 42b is a region which is irradiated with light having a second light amount not exceeding the curing threshold value of the imprint material but capable of curing the imprint material to the extent that the imprint material does not adhere to the mold 2 at the time of mold releasing. The third irradiation region 42c is a region which is irradiated with light having a third light amount smaller than the second light amount but capable of executing the imprint process without damaging the mold 2. The first irradiation region 42a, the second irradiation region 42b, and the third irradiation region 42c may be regions that are irradiated with light beams from the same light source, or may be regions that are simultaneously irradiated with light beams from different light sources. The positional relationship among the first irradiation region 42a, the second irradiation region 42b, and the third irradiation region 42c is, for example, the positional relationship in which they have the same center in the X and Y directions. That is, the light-shielding member 41 defines the respective irradiation regions such that the centers of the first irradiation region 42a, the second irradiation region 42b, and the third irradiation region 42c match the center of the shot region s15 subjected to the imprint process.

The shot region s15 is the shot region subjected to the imprint process in which the mold 2 is brought into contact with the imprint material on the substrate 1 to form a pattern, and the X-direction width and the Y-direction width are indicated by Sx and Sy, respectively. The values of Sx and Sy are arbitrarily set in accordance with the productivity of the apparatus and the use of the product. Consider a case in which the imprinting order is set in the order from the −Y direction to the +Y direction and from the −X direction to the +X direction. In this case, when the shot region s15 is irradiated with exposure light from the irradiator 40, no imprint material or the exposed imprint material exists in the regions adjacent to the shot region s15 on the −X side and the −Y side. No imprint material has been supplied to the region adjacent to the shot region s15 on the +Y side. The unexposed imprint material exists in the region adjacent to the shot region s15 on the +X side. In this case, when the exposure light is applied so as to include the entire surface of the shot region s15 to be exposed, a part of the imprint material in the shot region adjacent to the shot region s15 is also cured. If the imprint process is executed in a state in which a part of the imprint material is cured, the possibility of damaging the mold 2 so the desired pattern cannot be formed increases. In order to avoid such a situation, the light amount of the exposure light that protrudes outside the shot region to be exposed is set to be equal to or smaller than the curing threshold value of the imprint material. Further, the light amount of the light that protrudes outside the shot region is adjusted such that the imprint process can be executed without damaging the mold 2 upon executing the imprint process on the exposed adjacent shot region. In this embodiment, the end portion of the shot region s15 (first shot region) subjected to the imprint process on the adjacent shot region (second shot region) side is included in the second irradiation region 42b. The end portion of the adjacent shot region (second shot region) on the shot region s15 (first shot region) side is included in the third irradiation region 42c. The relationship among the first irradiation region 42a, the second irradiation region 42b, the third irradiation region 42c, and the shot region s15 is represented by the following expressions:

$$Ix1 < Sx = Ix2 < Ix3 \quad (4)$$

$$Sy < Iy1 < Iy2 < Iy3 \quad (5)$$

The exposure amount and irradiation region of each of the first irradiation region 42a, the second irradiation region 42b, and the third irradiation region 42c may be adjusted by adjusting the illuminance of the light source, or may be adjusted by adjusting the light-shielding member 41 of the irradiator 40. Alternatively, they may be adjusted using the light-shielding mold.

FIGS. 6A1 to 6C3 show the relationship among the shot regions s15, s16, and s17 adjacent to each other on the substrate 1, which continuously undergo the imprint process, and the light beams applied from the irradiator 40. The imprint process is executed on the substrate 1 in the order from the −Y direction to the +Y direction and from the −X direction to the +X direction. FIGS. 6A1, 6B1, and 6C1 show the states of the substrate 1 during the imprint process executed on the shot regions s15, s16, and s17, respectively. FIGS. 6A2, 6B2, and 6C2 show the states of the imprint materials on the shot regions s15, s16, and s17 during the imprint process executed on the shot regions s15, s16, and s17, respectively. Each of FIGS. 6A3, 6B3, and 6C3 shows the relationship among the X-direction positions of the shot regions s15, s16, and s17 and the exposure amount. In each of FIGS. 6A3, 6B3, and 6C3, the ordinate represents the ratio of the exposure amount to the curing threshold value of the imprint material. The solid line indicates the integrated exposure amount of up to each shot region, the dashed line indicates the exposure amount of each shot region during the exposure, and the dotted line indicates the exposure history up to immediately before each shot region.

In the third irradiation region 42c, when the imprint material 31a is irradiated with light having a light amount equal to or smaller than the curing threshold value, the imprint material 31a becomes an imprint material 31e in a semi-cured state. The imprint material 31e is in a state of maintaining the fluidity to the extent that a pattern can be formed on the substrate 1 without damaging the mold 2. The state of the imprint material 31e is determined by the physical property of the imprint material, the surface state of the substrate 1, the surrounding environmental atmosphere, and the integrated exposure amount. Note that the shots in the vicinity of the edge portions of the substrate 1 are omitted in each of FIGS. 6A1, 6B1, and 6C1, but from the viewpoint of improving the productivity of the apparatus, the imprint process can be executed in the regions in the edge portions.

Figures 1, 6A:
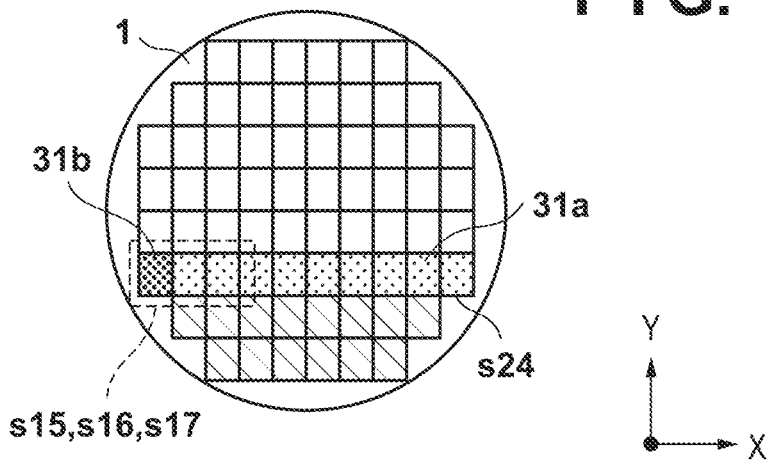
Figures 2, 6A:
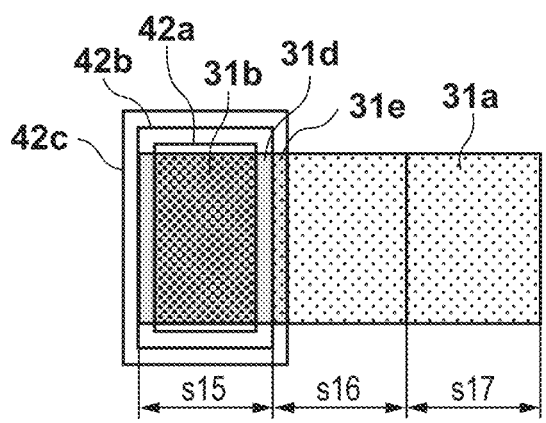
Figures 3, 6A:
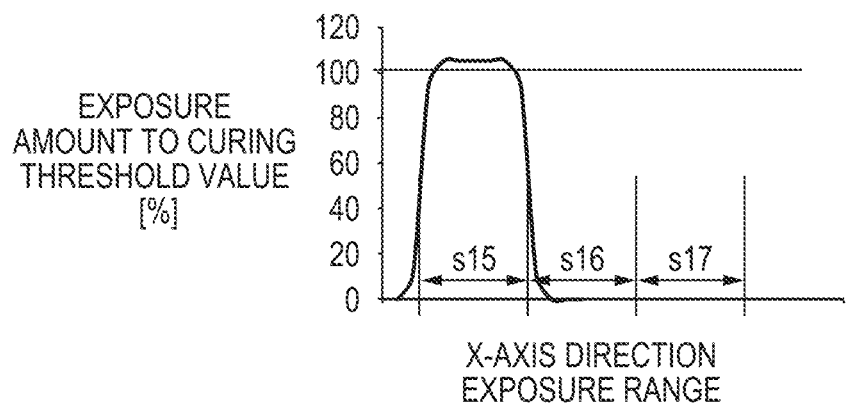

In FIG. 6A2, the imprint material 31b in the first irradiation region 42a exposed with a light amount exceeding the curing threshold value in the shot region s15 is cured, and the imprint material 31d in the second irradiation region 42b exposed with a light amount equal to or smaller than the curing threshold value becomes semi-cured. The imprint material 31e in the third irradiation region 42c in the adjacent shot region s16 is exposed with a small light amount equal to or smaller than the curing threshold value and becomes semi-cured.

Figures 1, 6B:
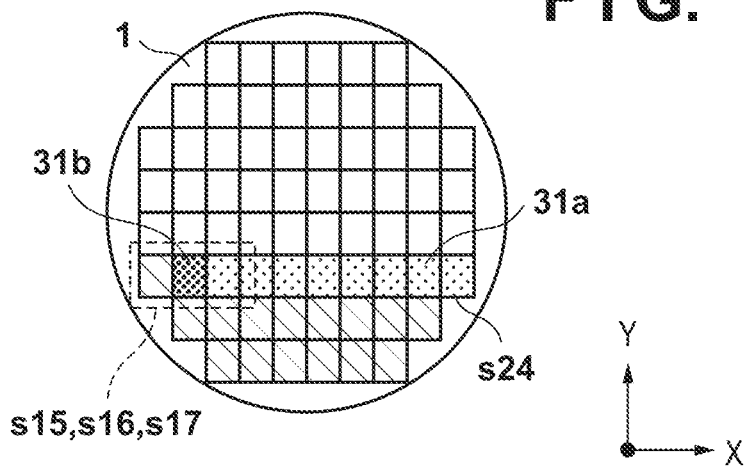
Figures 2, 6B:
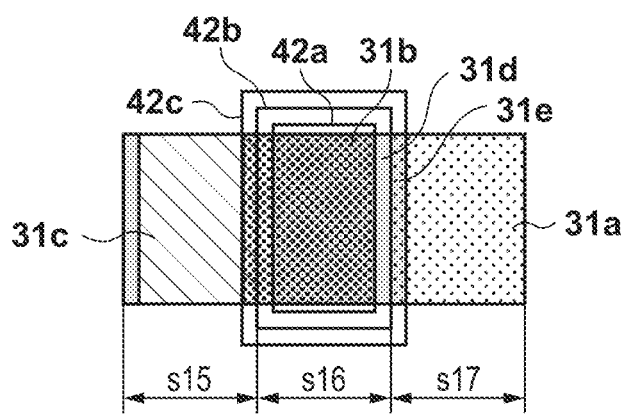
Figures 3, 6B:
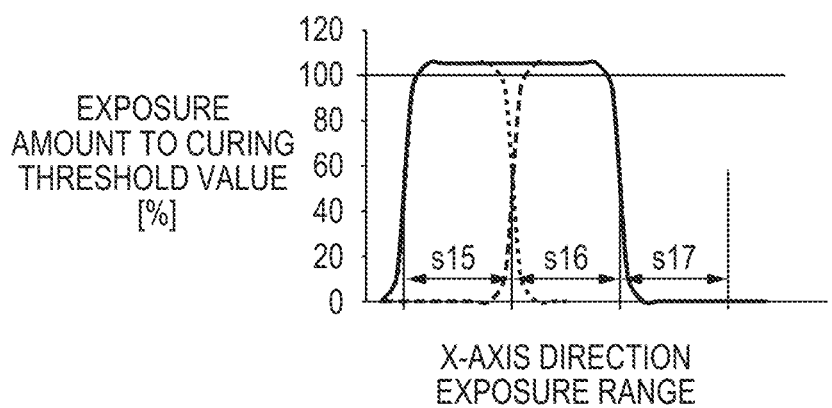
Figures 1, 6C:
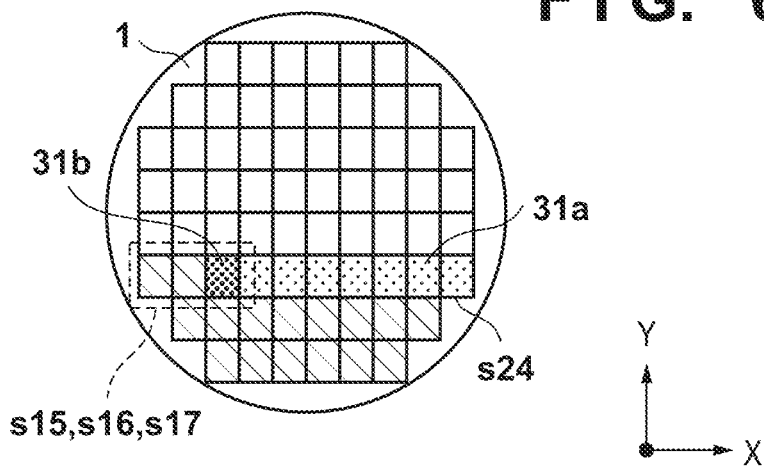
Figures 2, 6C:
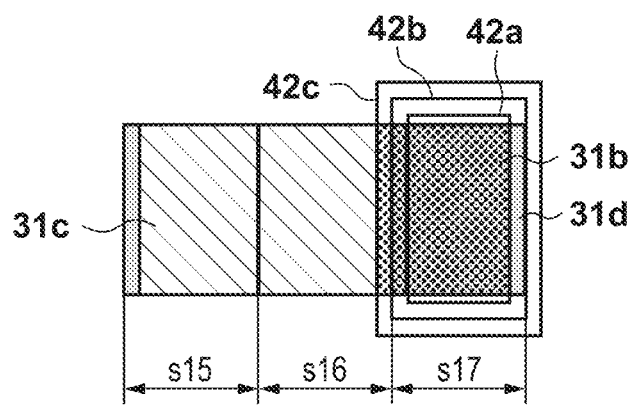
Figures 3, 6C:
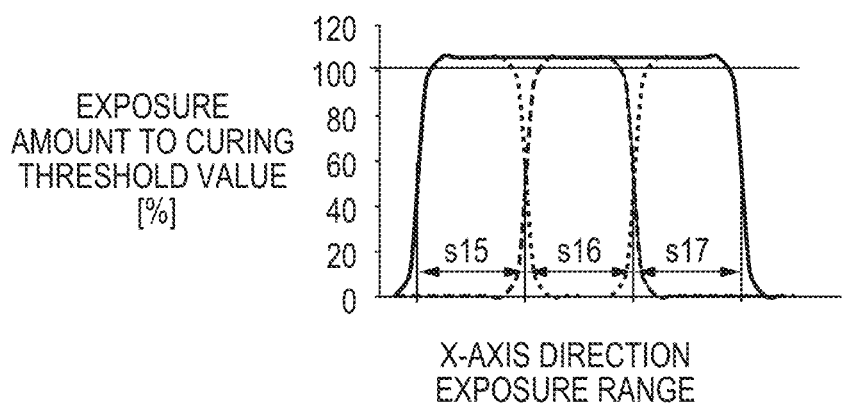

In FIG. 6B2, the imprint material in the first irradiation region 42a of the shot region s16 exposed with the light amount exceeding the curing threshold value is cured and becomes the imprint material 31b. The imprint material in the second irradiation region 42b has been semi-cured by the exposure to the third irradiation region 42c of the shot region s15, and is cured by being additively irradiated with the light having the light amount equal to or smaller than the curing threshold value. Thus, the imprint material 31d in the semi-cured state in the shot region s15 is complementarily exposed and cured by the light irradiation to the adjacent shot region s16.

When the imprint process is executed on the shot region s16, a part of the imprint material on the shot region s16 has been semi-cured by the imprint process executed on the shot region s15. Accordingly, when the mold 2 and the imprint materials 31a and 31d are brought into contact with each other, since the viscosity of the imprint material 31d is higher than the viscosity of the imprint material 31a, the desired pattern may not be formed due to an insufficient pressing force. Therefore, if the imprint materials in different viscosity states exist in the shot region, the controller 50 determines the pressing force in accordance with the ratio between the unexposed imprint material 31a and the imprint material 31d in the semi-cured state. In the contact step, the controller 50 controls driving of the mold holder 20 such that the pressing force of the mold 2 against the shot region is adjusted to the determined pressing force.

Here, let Ra be the region of the unexposed imprint material 31a, and Rd be the region of the imprint material 31d in the semi-cured state. Further, let Fa be the pressing force required in a state in which the unexposed imprint material 31a exists in the entire area of the shot region, and Fd be the pressing force required in a state in which the semi-cured imprint material 31d exists in the entire area of the shot region. In this case, a pressing force F1 in the imprint process on the shot region in which imprint materials having different viscosities coexist is expressed by the following equations:

$$Ra = Sx \times Sy - (Ix3 - Ix2)/2 \times Sy \quad (6)$$

$$Rd = (Ix3 - Ix2)/2 \times Sy \quad (7)$$

$$F1 = (Fa \times Ra + Fd \times Rd)/(Sx \times Sy) \quad (8)$$

The pressing force Fa and the pressing force Fd change depending on the type of the imprint material to be used, so that it is desirable to actually obtain them using the imprint apparatus 100. In addition, if the imprint materials 31a and 31d in different viscosity states exist in the shot region, the mold 2 may slip or tilt when the mold 2 is brought into contact with the imprint materials 31a and 31d on the substrate 1, so the desired pattern may not be formed. Therefore, when executing the imprint process on the shot region s16, the controller 50 controls the mold holder 20 in the contact step so as to bring the mold 2 into contact with the imprint material while correcting the posture of the mold 2. The correction of the posture of the mold 2 is based on the difference between the posture of the mold 2 before or at the time of contact with the imprint materials 31a and 31d and the posture of the mold 2 after the contact. As the difference used for the correction, the difference in force of the driving shaft of the mold holder 20 may be used, or the difference in driving amount of the mold holder 20 obtained by arranging a linear scale may be used. Further, the posture of the mold 2 at the time of contact between the mold 2 and the shot region in which only the imprint material 31a exists may be stored, and the difference may be corrected using the stored posture as a reference.

Alternatively, a method may be employed in which, in order to prevent the posture of the mold 2 from tilting at the time of the imprint process, the exposure is performed such that the viscosity distribution becomes symmetric in the shot region. This is achieved by, for example, setting the order of executing the imprint process on the plurality of shot regions in the order in which the viscosity distribution of the imprint material becomes symmetric in the shot region. More specifically, this is achieved by executing the imprint process in the order in which the imprint process is sequentially executed on every two shot regions in the X direction, and after the imprint process is executed on the shot region at the end in the +X direction or the shot region immediately before the shot region at the end, the imprint process is sequentially executed on the unexposed shot regions on the −X direction side.

Further, consider a case of executing the imprint process on the shot region s24 at the end in the +X direction. The shot region s24 is the shot region, among the plurality of shot regions adjacent to each other in one row, located at the end and having no adjacent shot region. In this case, the curing step is performed on the region shifted from the shot region s24 by one shot region in the +X direction. With this operation, the imprint material 31e in the semi-cured state is formed on each of the both sides of the shot region s24 in the X direction, resulting in the symmetric viscosity distribution of the imprint material. Thereafter, the imprint process is executed on the shot region s24.

As for the shot region s15 and the shot region s24, if there is no adjacent shot region in the X direction, exposure may be performed while extending Ix1 and Iy1 of the first irradiation region 42a to Sx and Sy, respectively. The extension of the first irradiation region 42a may be adjusted by driving the light-shielding member 41 of the irradiator 40. Alternatively, exposure sifted by one shot region may be performed before or after the exposure of the shot region s15 or s24. If the shot region s15 or s24 includes the outer peripheral portion of the substrate 1 but the unexposed imprint material exists within the first irradiation region 42a, the exposure may be performed without changing the adjusted position of the light-shielding member 41. If the unexposed imprint material exists outside the first irradiation region 42a, the light-shielding member 41 is driven so as to extend the first irradiation region 42a and the second irradiation region 42b and the exposure is performed. Alternatively, before the exposure of the shot region s15, the exposure light may be applied to a position shifted from the shot region s15 by one shot region in the −X-axis direction to cure the shot region s15. Further, after the exposure of the shot region s24, the exposure light may be applied to a position shifted from the shot region s24 by one shot region in the +X-axis direction to cure the shot region s24. The imprint apparatus 100 performs the series of operations on all the shot regions of the substrate 1 to form the pattern of the mold 2 on each of all the shot regions.

Second Embodiment

Figure 7:
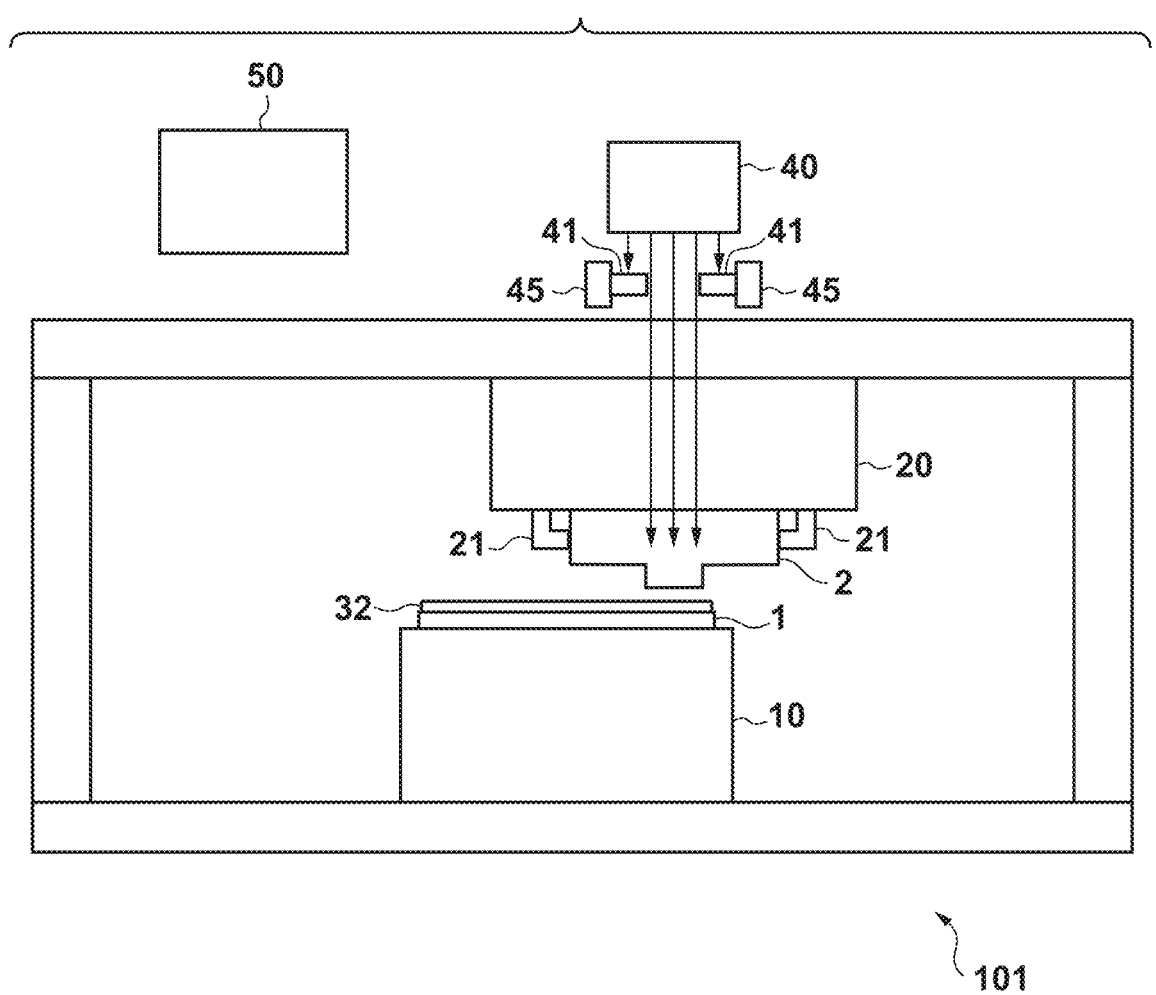
FIG. 7 is a view showing the arrangement of an imprint apparatus.

FIG. 7 is a view showing the arrangement of an imprint apparatus 101 in the second embodiment. The imprint material 31 is supplied onto the substrate 1 by the supply unit 30 in the first embodiment (FIG. 1), but in this embodiment, an imprint material 32 is applied to a substrate 1 by, for example, a coater/developer or the like outside the imprint apparatus 101. Other components are almost similar to those in the first embodiment.

With reference to FIGS. 8A to 8D, an example of the imprint sequence for the substrate 1 by the imprint apparatus 101 in the second embodiment will be described. First, for example, the coater/developer outside the imprint apparatus 101 applies an imprint material 32a to the entire surface of the substrate 1. In order to show this, the entire surface of the substrate is shown in a light dot background in each of FIGS. 8A to 8D. A shot region sb shown in a dark dot background represents a state in which the imprint process using a mold 2 is being executed. Each hatched shot region sc represents a state in which the imprint process using the mold 2 has been completed.

Figure 8A:
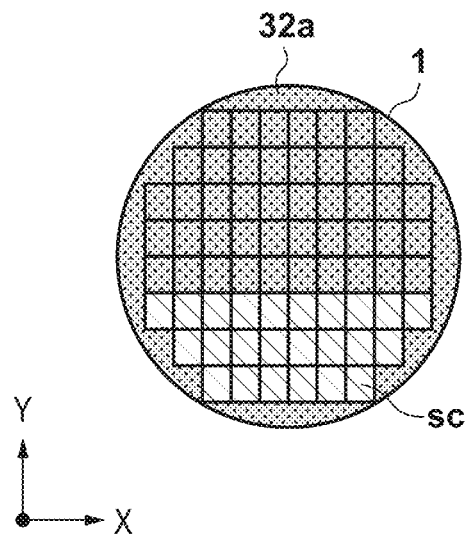
FIGS. 8A to 8D are views showing an example of an imprint sequence.
Figure 8B:
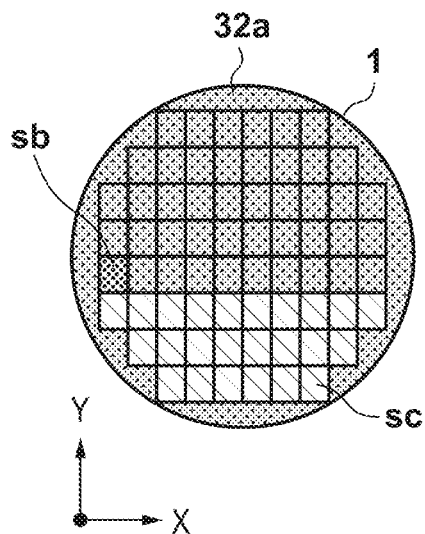
Figure 8C:
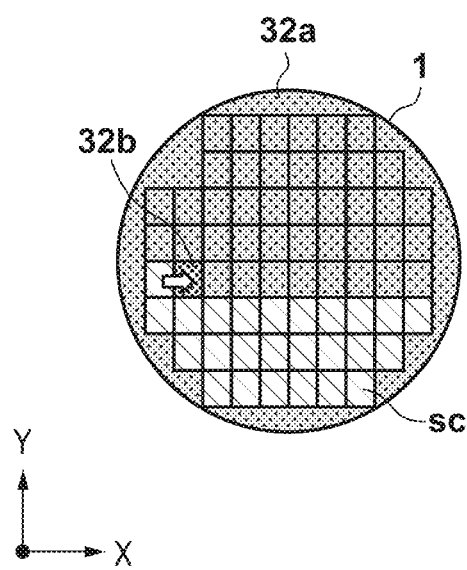
Figure 8D:
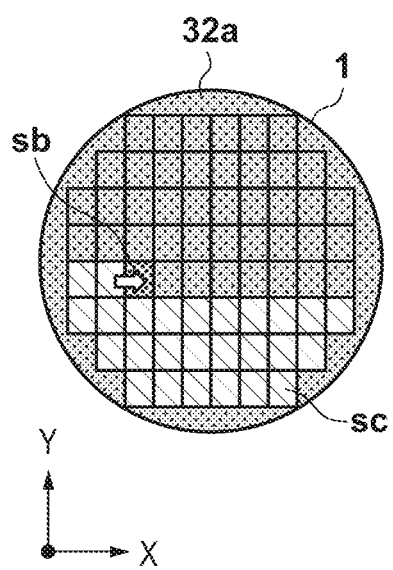

FIG. 8A shows a state in which the imprint process has been completed for the shot regions in lower three rows among the plurality of shot regions. The imprint apparatus 101 drives a substrate stage 10 such that the next region subjected to the imprint process is arranged immediately below the mold 2. FIG. 8B shows a state in which the imprint process on the shot region sb is being executed and the mold 2 and the imprint material on the shot region sb have been brought into contact with each other by the mold holder 20 lowering the mold 2. Each of FIGS. 8C and 8D shows a state in which the target shot region is shifted to the adjacent shot (that is, the substrate stage 10 is driven such that the adjacent shot region comes immediately below the mold 2) and the imprint process is executed on the shot region sb. In this embodiment, the imprint process is sequentially executed in the order from the −Y side to the +Y side and from the −X side to the +X side, but the imprinting order is arbitrarily selected in consideration of the productivity and arrangement of the apparatus.

Figure 9B:
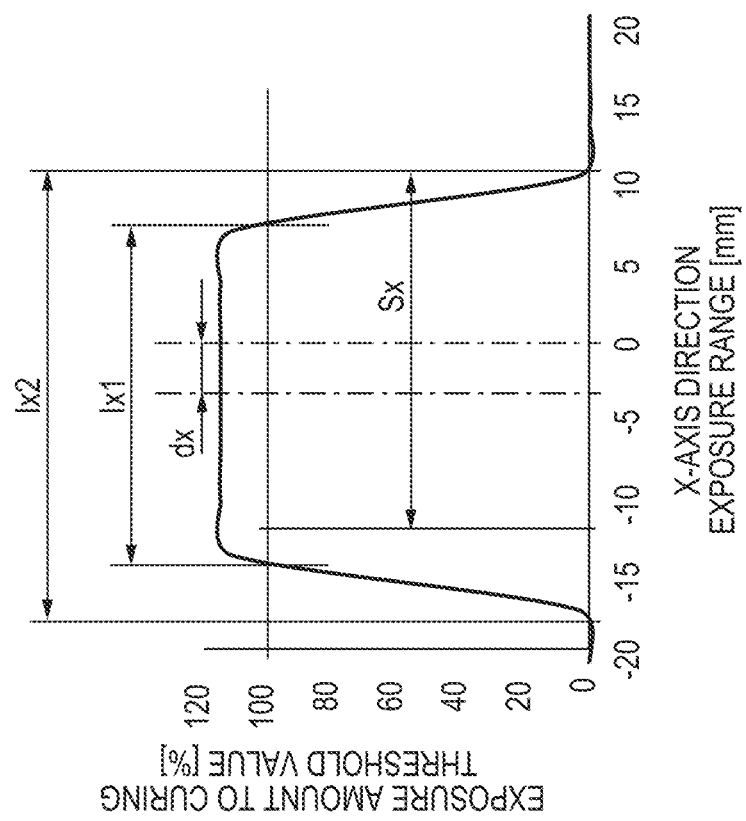
FIGS. 9A and 9B are views showing the relationship among a shot region and light irradiation regions.
Figure 9A:
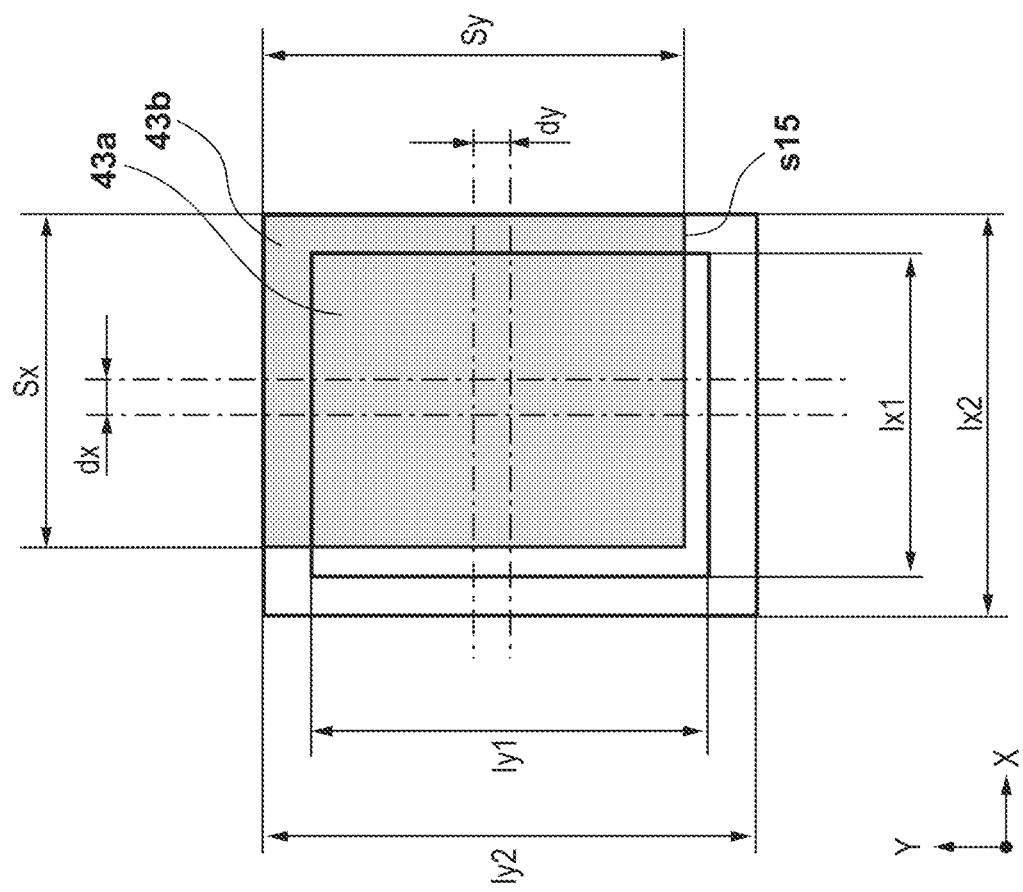

FIGS. 9A and 9B are views showing the relationship among a shot region s15 on the substrate 1 and the light beams applied from an irradiator 40 upon executing the imprint process in the order from the −Y direction to the +Y direction and from the −X direction to the +X direction in the imprint apparatus 101. FIG. 9A shows the relationship among the shot region s15 and the irradiation regions of the light beams from the irradiator 40 to the shot region s15. FIG. 9B shows the relationship between the X-direction position of the shot region and the exposure amount. The ordinate of FIG. 9B represents the ratio of the exposure amount to the curing threshold value of the imprint material. FIG. 9B shows that the exposure amount exceeds the curing threshold value of the imprint material in the central portion of the shot region in the X direction, but the exposure amount does not reach the curing threshold value of the imprint material in the end portions in the X direction.

In FIG. 9A, a first irradiation region 43a is a region which is irradiated with light having a light amount exceeding the curing threshold value of the imprint material, and the X-direction width and the Y-direction width of the first irradiation region 43a are indicated by Ix1 and Iy1, respectively. A second irradiation region 43b is a region larger than the first irradiation region 43a surrounding the first irradiation region 43a. The X-direction width and the Y-direction width of the second irradiation region 43b are indicated by Ix2 and Iy2, respectively. The region of the second irradiation region 43b outside the first irradiation region 43a is a region which is irradiated with light having a light amount not exceeding the curing threshold value of the imprint material but capable of curing the imprint material to the extent that the imprint material does not adhere to the mold 2 at the time of mold releasing. The first irradiation region 43a and the second irradiation region 43b may be regions that are irradiated with light beams from the same light source, or may be regions that are simultaneously irradiated with light beams from different light sources. The positional relationship between the first irradiation region 43a and the second irradiation region 43b is, for example, the positional relationship in which they have the same center in the X and Y directions.

The shot region s15 is a region in which the mold 2 is brought into contact with the imprint material on the substrate 1 to form a pattern, and the X-direction width and the Y-direction width are indicated by Sx and Sy, respectively. The values of Sx and Sy are arbitrarily set in accordance with the productivity of the apparatus and the use of the product. Consider a case in which the imprinting order is set in the order from the −Y direction to the +Y direction and from the −X direction to the +X direction. In this case, when the shot region s15 is irradiated with exposure light from the irradiator 40, no imprint material or the exposed imprint material exists in the regions adjacent to the shot region s15 on the −X side and the −Y side. There is the imprint material in an unexposed state in each of the regions adjacent to the shot region s15 on the +X side and the +Y side. When the light is applied so as to include the entire surface of the shot region s15 to be exposed, a part of the imprint material in the shot region adjacent to the shot region s15 is also cured. If the imprint process is executed in a state in which a part of the imprint material is cured, the mold 2 may be damaged so the desired pattern may not be formed. Therefore, for example, the irradiation region is adjusted such that no exposure light extrudes to the +X direction side and the +Y direction side of the shot region to be exposed. Accordingly, in this embodiment, the second irradiation region 43b is adjusted such that its end portions in the +X direction and the +Y direction match those of the shot region s15. Further, there is no problem even if the exposure light is applied to the shot regions adjacent to shot region to be exposed in the −X direction and the −Y direction so that, from the viewpoint of the productivity of the apparatus, the irradiation region may be adjusted such that the exposure light exceeding the curing threshold value of the imprint material extrudes from the shot region subjected to the imprint process. Thus, the relationship among Ix1 and Iy1 of the first irradiation region 43a and Sx and Sy of the shot region s15 is expressed by the following inequalities:

$$Ix1 \geq Sx \tag{9}$$

$$Iy1 \geq Sy \tag{10}$$

Further, an X-direction distance dx and a Y-direction distance dy between each of the centers of the first irradiation region 43a and the second irradiation region 43b and the center of the shot region s15 are expressed by the following equations. The direction of each of dx and dy is determined by the imprinting order. If the imprinting order is the order from the −Y direction to the +Y direction and from the −X direction to the +X direction, the direction of dx is the −X direction from the center of the shot region s15, and the direction of dy is the −Y direction from the center of the shot region s15.

$$dx=(Ix2-Sx)/2 \tag{11}$$

$$dy=(Iy2-Sy)/2 \tag{12}$$

The exposure amount and irradiation region of each of the first irradiation region 43a and the second irradiation region 43b may be adjusted by adjusting the illuminance of the light source, or may be adjusted by adjusting the light-shielding member 41 of the irradiator 40. Alternatively, they may be adjusted using a light-shielding mold.

FIGS. 10A to 10F show, regarding the shot regions s15, s16, and s17, and shot regions s25, s26, and s27 adjacent to each other, the states of the imprint materials in the respective shot regions upon continuously executing the imprint process. FIGS. 10A to 10F show the states of the imprint materials during exposure of the shot regions s15, s16, s17, s25, s26, and s27, respectively.

Figure 10A:
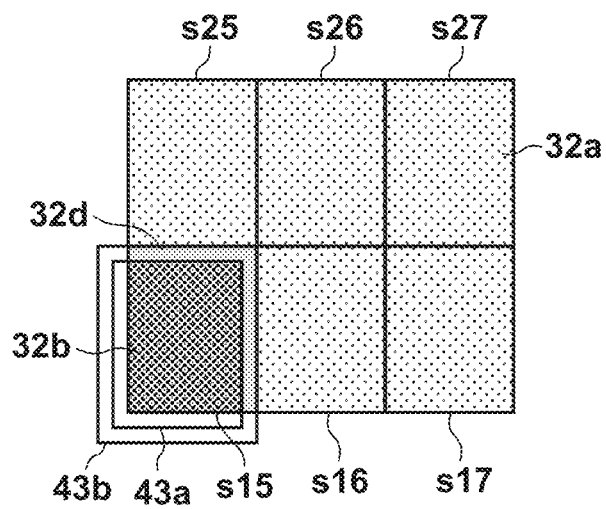
FIGS. 10A to 10F are views showing the relationship among a plurality of shot regions adjacent to each other and the light irradiation ranges.

The imprint process is executed on the substrate 1 in the order from the −Y direction to the +Y direction and from the −X direction to the +X direction. In FIG. 10A, in the shot region s15 subjected to the imprint process, an imprint material 32b in the region exposed with a light amount exceeding the curing threshold value is cured, and an imprint material 32d in the region exposed with a light amount equal to or smaller than the curing threshold value becomes semi-cured. The imprint material 32d in the semi-cured state in the shot region s15 is complementarily exposed and cured by the light irradiation in the imprint process executed on each of the adjacent shot regions s16, s25, and s26. Note that the light intensity may be increased such that the imprint material 32d in the semi-cured state in the shot region s15 is cured without the light irradiation in the imprint process executed on the shot region s26.

Figure 10B:
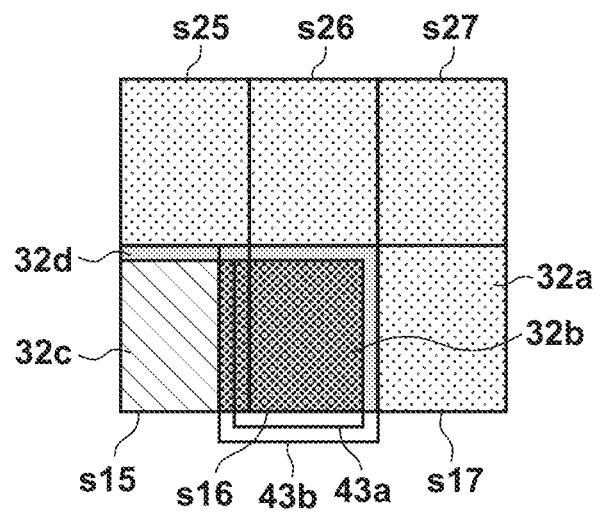
Figure 10C:
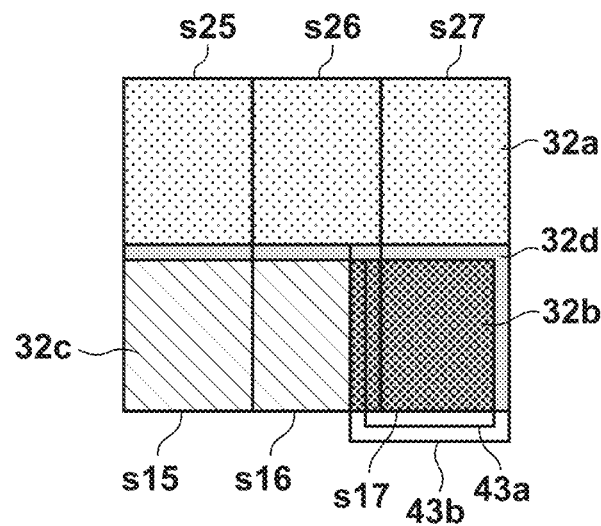
Figure 10D:
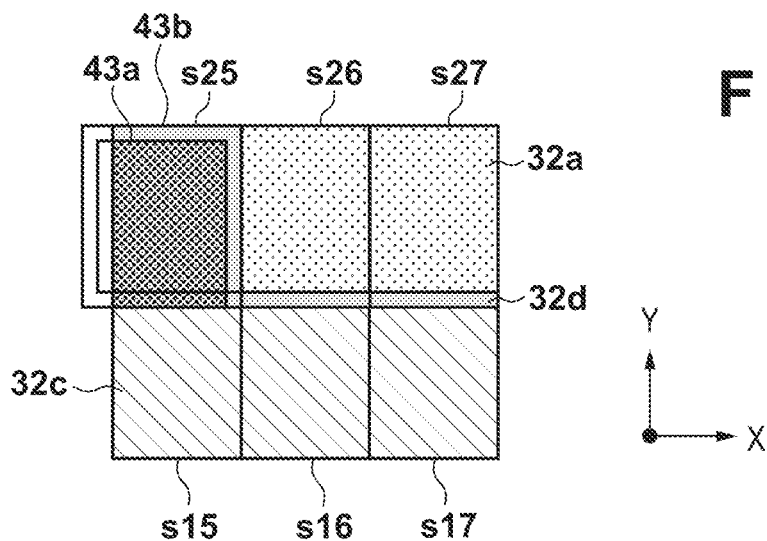
Figure 10E:
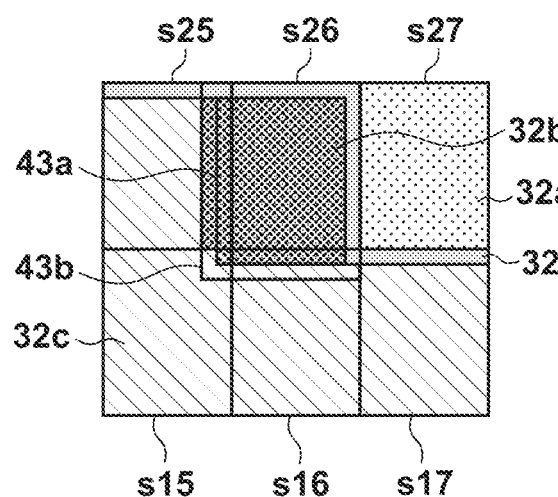
Figure 10F:
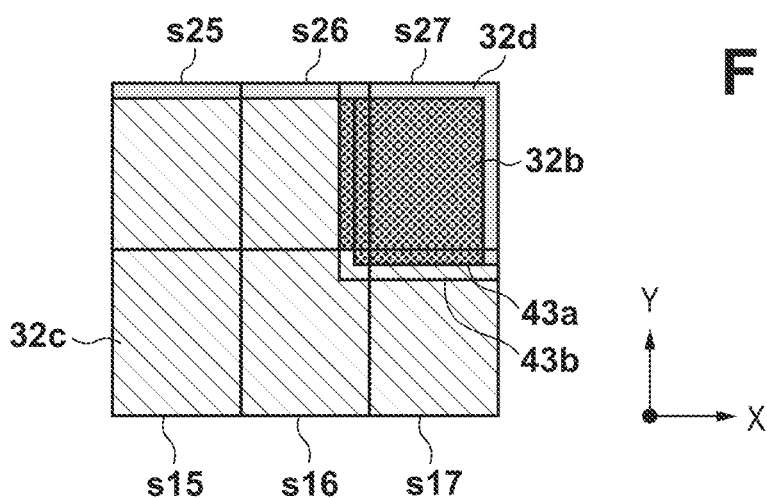
Figure 11A:
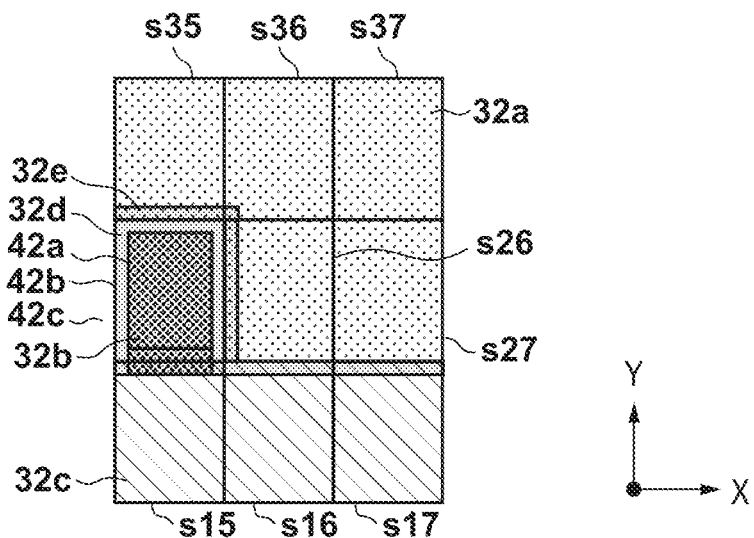
FIGS. 11A to 11F are views showing the relationship among a plurality of shot regions adjacent to each other and the light irradiation ranges.
Figure 11B:
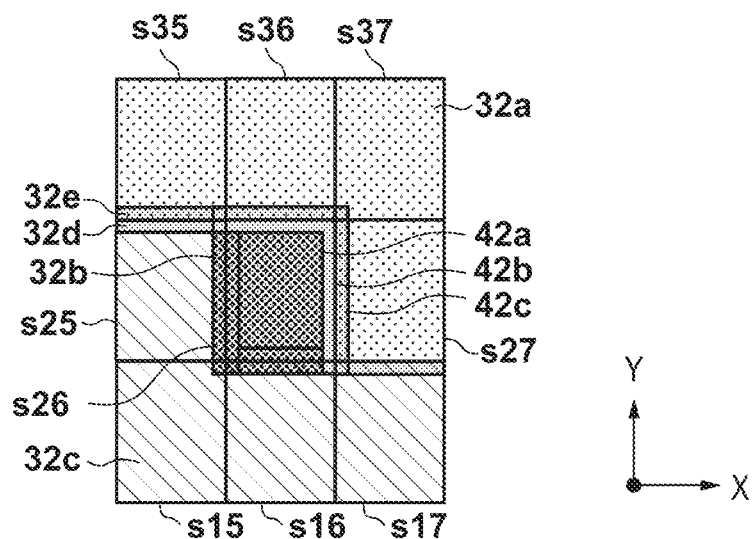
Figure 11C:
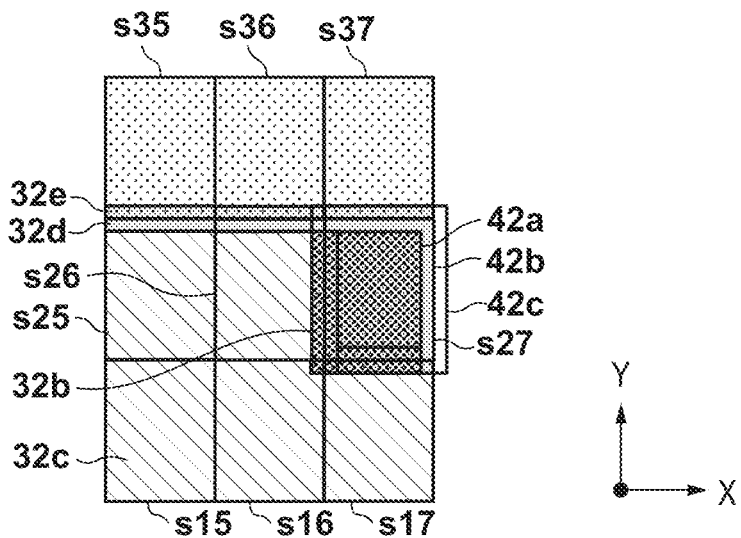
Figure 11D:
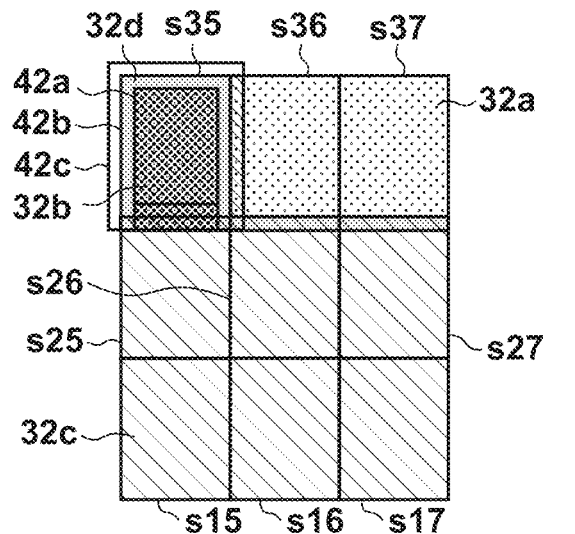
Figure 11E:
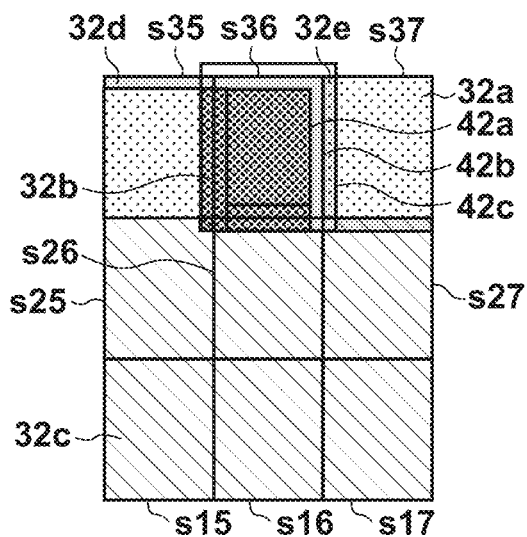
Figure 11F:
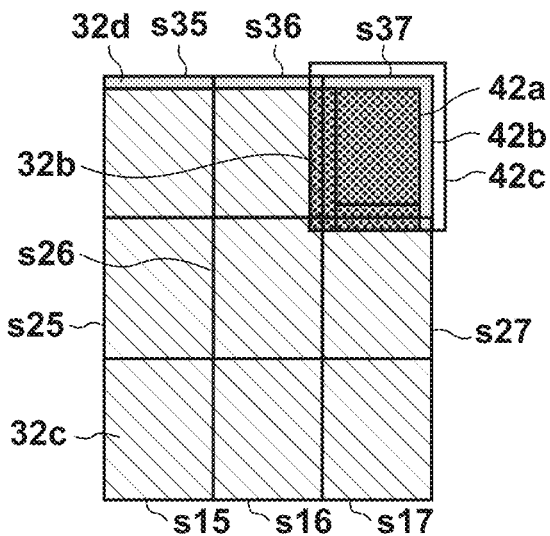

Similarly, in FIG. 10B, in the shot region s16 subjected to the imprint process, the imprint material 32b in the region exposed with the light amount exceeding the curing threshold value is cured, and the imprint material 32d in the region exposed with the light amount equal to or smaller than the curing threshold value becomes semi-cured. The imprint material 32d in the semi-cured state in the shot region s16 is complementarily exposed and cured by the light irradiation in the imprint process executed on each of the adjacent shot regions s17, s26, and s27.

If there is no unexposed imprint material in the adjacent shot region, the first irradiation region 43a and the second irradiation region 43b may be extended and the imprint material may be collectively cured. Alternatively, the imprint material in the semi-cured state may be cured by applying the light to a position shifted by one shot region without changing the first irradiation region 43a and the second irradiation region 43b. The imprint apparatus 101 performs the series of operations on all the shot regions of the substrate 1 to form the pattern of the mold 2 on each of all the shot regions.

FIGS. 11A to 11F show, regarding the shot regions s25, s26, and s27, and shot regions s35, s36, and s37 adjacent to each other, the states of the imprint materials in the respective shot regions upon continuously executing the imprint process. FIGS. 11A to 11F show the states of the imprint materials during exposure of the shot regions s25, s26, s27, s35, s36, and s37, respectively.

In a third irradiation region 42c, when the imprint material 32a is irradiated with light having a light amount equal to or smaller than the curing threshold value, the imprint material 32a becomes an imprint material 32e in a semi-cured state. The imprint material 32e is in a state of maintaining the fluidity to the extent that a pattern can be formed on the substrate 1 without damaging the mold 2. The state of the imprint material 32e is determined by the physical property of the imprint material, the surface state of the substrate 1, the surrounding environmental atmosphere, and the integrated exposure amount.

In each shot region, the imprint material 32b in a first irradiation region 42a is exposed and cured with a light amount exceeding the curing threshold value. Each of the imprint material 32d in a second irradiation region 42b and the imprint material 32e in the third irradiation region 42c is exposed with a light amount equal to or smaller than the curing threshold value and semi-cured. The semi-cured imprint materials 32d and 32e are cured by the light irradiation to each of the second irradiation region 42b and the third irradiation region 42c during the imprint process on the adjacent shot region in the X direction or the Y direction. For example, in FIG. 11B, the imprint material in the second irradiation region 42b of the shot region s26 exposed with the light amount equal to smaller than the curing threshold value is semi-cured. This imprint material is cured by the light irradiation to each of the second irradiation region 42b and the third irradiation region 42c during the imprint process on each of the shot regions s27, s35, s36, and s37 adjacent to the shot region s26 as shown in each of FIGS. 11C, 11D, 11E, and 11F.

When the imprint process is executed on the shot region s26, a part of the imprint material in the shot region s26 is in the semi-cured state. Accordingly, when the mold 2 is brought into contact with the imprint materials 32a and 32d on the substrate 1, since the viscosity of the imprint material 32d is higher than the viscosity of the imprint material 32a, the desired pattern may not be formed due to an insufficient pressing force. Therefore, in this embodiment, the pressing force is determined in accordance with the ratio between the unexposed imprint material 32a and the imprint material 32d in the semi-cured state in the shot region.

Further, when the mold 2 is brought into contact with the imprint material 32a and the imprint material 32d in different viscosity states on the substrate 1, the mold 2 may slip or tilt so the desired pattern may not be formed. Therefore, in this embodiment, the contact operation may be performed while correcting the posture of the mold 2. The pressing force of the mold 2 and the posture of the mold 2 in the contact operation are corrected by the method as described in the first embodiment.

As in the first embodiment, in order to prevent the posture of the mold 2 from tilting, the exposure may be performed in the imprinting order that is changed such that the arrangement of the imprint materials in the shot region becomes symmetric. The imprint apparatus 101 performs the series of operations on all the shot regions of the substrate 1 to form the pattern of the mold 2 on each of all the shot regions.

According to the various embodiments described above, it is possible to provide an imprint apparatus advantageous in achieving both the protection performance of the pattern portion of a mold and throughput.

Embodiments of an Article Manufacturing Method

The pattern of the cured product formed using the imprint apparatus is used permanently on at least a part of the various articles or temporarily in manufacturing the various articles. The article may be an electric circuit element, an optical element, a MEMS, a recording element, a sensor, a mold, or the like. Examples of the electric circuit element include a volatile or nonvolatile semiconductor memory such as a DRAM, SRAM, a flash memory, and a MRAM, and semiconductor elements such as LSIs, CCDs, image sensors, and FPGA. The mold may be an imprint mold or the like.

The pattern of the cured product may be used as it is as a constituent member of at least a part of the aforementioned article, or may be temporarily used as a resist mask. After etching, ion implantation, or the like is performed in the substrate processing step, the resist mask is removed.

Next, the article manufacturing method will be described. In step SA of FIG. 12, a substrate 1z such as a silicon substrate having a surface on which a processed material 2z such as an insulator is formed is prepared, and subsequently, an imprint material 3z is applied to the surface of the processed material 2z by an ink-jet method or the like. Here, an imprint material 3z in the form of a plurality of droplets is applied onto a substrate.

Figure 12:
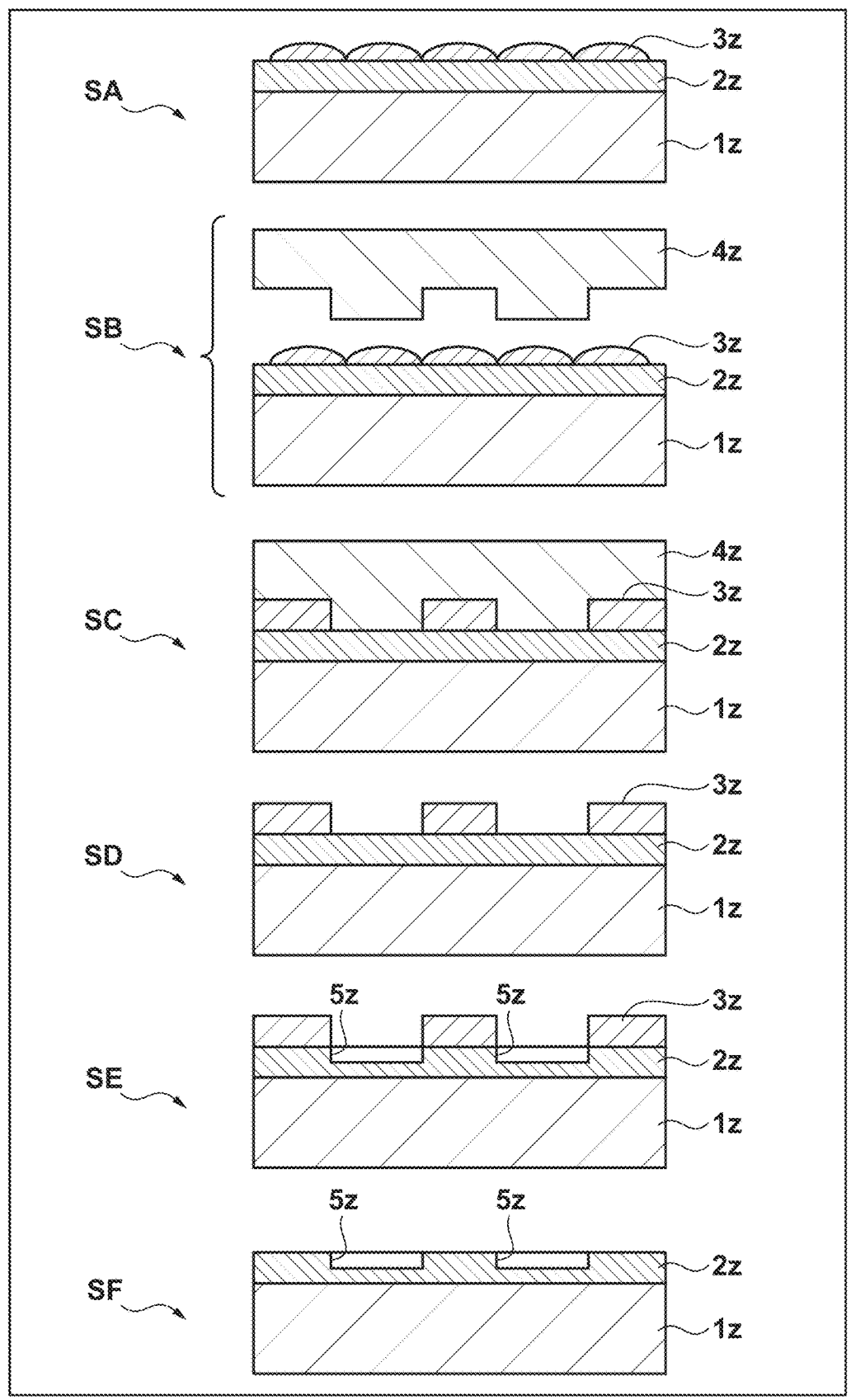
FIG. 12 is a view for explaining a method of manufacturing an article according to an embodiment.

In step SB of FIG. 12, the side of the mold 4z for imprinting on which the concavo-convex pattern is formed is opposite the imprint material 3z on the substrate. In step SC of FIG. 12, the substrate 1z to which the imprint material 3z has been applied and the mold 4z are brought into contact, and the pressure is applied. The imprint material 3z fills the gaps between the mold 4z and the processed material 2z. In this state, when light is irradiated as curing energy through the mold 4z, the imprint material 3z is cured.

In step SD of FIG. 12, when the mold 4z and the substrate 1z are separated after curing the imprint material 3z, patterns of a cured product of the imprint material 3z are formed on the substrate 1z. In the pattern of the cured product, the concave portion of the mold corresponds to the convex portion of the cured product, and the convex portion of the mold corresponds to the concave portion of the cured product, that is, the concave-convex pattern of the mold 4z is transferred onto the imprint material 3z.

In the step SE of FIG. 12, when etching is performed using the cured product pattern as an etching resistant mask, portions of the surfaces of the processed material 2z where there is no cured product or that remain thin are removed, resulting in a trench 5z. In step SF of FIG. 12, when the patterns of the cured product are removed, an article in which the trench 5z is formed on the surface of the processed material 2z can be obtained. Although the pattern of the cured product is removed here, it may be used as a film for interlayer insulation included in a semiconductor element or the like, that is, a constituent member of an article, for example, without being removed even after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-226804, filed Dec. 16, 2019, which is hereby incorporated by reference herein in its entirety.

What is claimed is:

1. An imprint apparatus that performs a supply step of supplying an imprint material onto a substrate, a contact step of bringing the imprint material on the substrate and a mold into contact with each other, a curing step of curing the imprint material by light irradiation in a state in which the imprint material and the mold are in contact with each other, and a mold releasing step of separating the mold from the cured imprint material, wherein the imprint apparatus is configured to perform the supply step on each of a plurality of shot regions adjacent to each other on the substrate and, after the supply step, execute an imprint process including the contact step, the curing step, and the mold releasing step for each shot region of the plurality of shot regions, the imprint apparatus comprising:

an irradiator configured to irradiate the imprint material on the shot region with light in the curing step; and a light-shielding member configured to define an irradiation region of the light from the irradiator, wherein the light-shielding member is configured to define the irradiation region such that the imprint material in an end portion of a first shot region on a side of a second shot region adjacent to the first shot region is complementarily cured by light irradiation in the curing step performed on the second shot region, wherein the first shot region is a shot region subjected to the imprint process, the second shot region is a shot region that is subjected to the imprint process after the first shot region, and the light-shielding member is configured to define the irradiation region such that an end portion, on a side of the first shot region, of a shot region adjacent to the first shot region and having undergone the imprint process is irradiated with the light, and the second shot region having not undergone the imprint process is not irradiated with the light, wherein the irradiation region includes:

a first irradiation region which is irradiated with light having a first light amount exceeding a curing threshold value of the imprint material; and a second irradiation region which is a region outside the first irradiation region and surrounding the first irradiation region, and is irradiated with light having a second light amount not exceeding the curing threshold value, and wherein the end portion of the first shot region on the side of the second shot region is included in the second irradiation region.

2. The apparatus according to claim 1, wherein the light-shielding member-is configured to define, as the irradiation region, a region having a center at a position offset from a center of the first shot region in a direction opposite to a direction toward the second shot region.

3. The apparatus according to claim 1, wherein, when irradiated with the light having the second light amount, the imprint material in the end portion of the first shot region on the side of the second shot region becomes a viscosity state in which a viscosity is lower than in a cured state but a pattern transferred from the mold is maintained, and the imprint material comes into tight contact with the substrate with a force not smaller than a mold releasing force generated at the time of mold releasing and does not adhere to the mold upon releasing the mold.

4. The apparatus according to claim 1, further comprising:
a driver configured to drive the light-shielding member; and
a controller configured to control the driver,
wherein, in a case where there is no unexposed imprint material in a shot region adjacent to the first shot region, the controller is configured to control the driver such that an entire surface of the first shot region is irradiated with the light having the first light amount exceeding the curing threshold value of the imprint material.

5. A method of manufacturing an article, comprising:
forming a pattern on the substrate using the imprint apparatus defined in claim 1; and
processing the substrate on which the pattern has been formed,
wherein the article is manufactured from the processed substrate.

6. An imprint apparatus that performs a supply step of supplying an imprint material onto a substrate, a contact step of bringing the imprint material on the substrate and a mold into contact with each other, a curing step of curing the imprint material by light irradiation in a state in which the imprint material and the mold are in contact with each other, and a mold releasing step of separating the mold from the cured imprint material, wherein the imprint apparatus is configured to perform the supply step on each of a plurality of shot regions adjacent to each other on the substrate and, after the supply step, execute an imprint process including the contact step, the curing step, and the mold releasing step for each shot region of the plurality of shot regions, the imprint apparatus comprising:
an irradiator configured to irradiate the imprint material on the shot region with light in the curing step; and
a light-shielding member configured to define an irradiation region of the light from the irradiator,
wherein the light-shielding member is configured to define the irradiation region such that the imprint material in an end portion of a first shot region on a side of a second shot region adjacent to the first shot region is complementarily cured by light irradiation in the curing step performed on the second shot region,
wherein the first shot region is a shot region subjected to the imprint process, the second shot region is a shot region that is subjected to the imprint process after the first shot region, and the light-shielding member defines the irradiation region such that the light is also applied to an end portion, on a side of the first shot region, of a shot region adjacent to the first shot region and having undergone the imprint process and an end portion, on a side of the first shot region, of the second shot region having not undergone the imprint process, wherein the irradiation region includes:
a first irradiation region which is irradiated with light having a first light amount exceeding a curing threshold value of the imprint material;
a second irradiation region which is a region outside the first irradiation region and surrounding the first irradiation region, and is irradiated with light having a second light amount not exceeding the curing threshold value; and
a third irradiation region which is a region outside the second irradiation region and surrounding the second irradiation region, and is irradiated with light having a third light amount smaller than the second light amount, and wherein the end portion of the first shot region on the side of the second shot region is included in the second irradiation region, and an end portion of the second shot region on a side of the first shot region is included in the third irradiation region.

7. The apparatus according to claim 6, wherein the light-shielding member is configured to define the irradiation region such that a center of the irradiation region matches a center of the first shot region.

8. The apparatus according to claim 6, further comprising:
a mold holder configured to move while holding the mold; and
a controller configured to control the mold holder,
wherein, in the contact step, the controller is configured to control driving of the mold holder so as to adjust a pressing force of the mold against the shot region in accordance with a ratio between an unexposed imprint material and an imprint material in a semi-cured state in the shot region subjected to the imprint process.

9. The apparatus according to claim 6, further comprising:
a mold holder configured to move while holding the mold; and
a controller configured to control the mold holder,
wherein, in the contact step, the controller is configured to control the mold holder so as to bring the mold and the imprint material into contact with each other while correcting a posture of the mold such that the mold does not tilt with respect to the shot region subjected to the imprint process.

10. The apparatus according to claim 6, wherein an order of shot regions to execute the imprint process on the plurality of shot regions is an order in which a viscosity distribution of the imprint material becomes symmetric in the shot region.

11. The apparatus according claim 6, wherein, in a case where the first shot region is a shot region, among the plurality of shot regions, located at an end and having no adjacent second shot region, a viscosity distribution of the imprint material in the first shot region is made symmetric by performing the curing step on a region shifted from the first shot region by one shot region, and the imprint process is subsequently executed on the first shot region.

12. The apparatus according to claim 6, further comprising:
a driver configured to drive the light-shielding member; and
a controller configured to control the driver, wherein, in a case where there is no unexposed imprint material in a shot region adjacent to the first shot region, the controller is configured to control the driver such that an entire surface of the first shot region is irradiated with the light having the first light amount exceeding the curing threshold value of the imprint material.

13. A method of manufacturing an article, comprising:

forming a pattern on the substrate using the imprint apparatus defined in claim 6; and processing the substrate on which the pattern has been formed, wherein the article is manufactured from the processed substrate.

* * * * *